US012037013B1

(12) United States Patent
Linscott et al.

(10) Patent No.: US 12,037,013 B1
(45) Date of Patent: Jul. 16, 2024

(54) AUTOMATED REINFORCEMENT LEARNING SCENARIO VARIATION AND IMPACT PENALTIES

(71) Applicant: Zoox, Inc., Foster City, CA (US)

(72) Inventors: Gary Linscott, Cupertino, CA (US); Andreas Pasternak, Mountain View, CA (US); Jefferson Bradfield Packer, San Francisco, CA (US); Marin Kobilarov, Baltimore, MD (US)

(73) Assignee: Zoox, Inc., Foster City, CA (US)

( * ) Notice: Subject to any disclaimer, the term of this patent is extended or adjusted under 35 U.S.C. 154(b) by 342 days.

(21) Appl. No.: 17/515,244

(22) Filed: Oct. 29, 2021

(51) Int. Cl.
*G06N 20/00* (2019.01)
*B60W 60/00* (2020.01)
*G06F 11/34* (2006.01)

(52) U.S. Cl.
CPC .......... *B60W 60/0011* (2020.02); *B60W 60/00272* (2020.02); *G06F 11/3452* (2013.01); *G06F 11/3457* (2013.01); *G06N 20/00* (2019.01)

(58) Field of Classification Search
CPC .......... B60R 21/01338; B60R 21/0134; G06N 3/08; G06N 5/01; G06N 5/04; G06N 20/20; G06N 20/00; G08G 1/0112; G08G 1/0133; B60W 60/0011; B60W 60/00272; G06F 11/3452; G06F 11/3457
See application file for complete search history.

(56) References Cited

U.S. PATENT DOCUMENTS

| 10,649,459 | B2 | 5/2020 | Wang et al. | |
| 11,577,741 | B1 * | 2/2023 | Reschka | B60W 50/045 |
| 11,648,962 | B1 * | 5/2023 | Crego | G08G 1/166 |
| | | | | 701/26 |
| 2013/0253782 | A1 * | 9/2013 | Saltsman | G01M 17/007 |
| | | | | 703/8 |
| 2021/0165932 | A1 * | 6/2021 | Mohan | G06F 11/3476 |
| 2021/0294323 | A1 * | 9/2021 | Bentahar | G06N 20/00 |
| 2022/0080962 | A1 * | 3/2022 | Bin-Nun | B60W 30/0956 |
| 2022/0118931 | A1 * | 4/2022 | Qi | B60R 21/0134 |
| 2023/0131632 | A1 * | 4/2023 | Hartnett | G06F 30/20 |
| | | | | 703/8 |

OTHER PUBLICATIONS

"Muller, Machine Learning Based Prediction of Crash Severity Distributions for Mitigation Strategies, Feb. 2018, Journal of Advances in Information Technology vol. 9, No. 1" (Year: 2018).*

* cited by examiner

*Primary Examiner* — Tiffany P Young
(74) *Attorney, Agent, or Firm* — Lee & Hayes, P.C.

(57) ABSTRACT

Automating reinforcement learning for autonomous vehicles may include assigning a probability with a scenario and varying that probability based at least in part on changes in performance by the autonomous vehicle associated with that scenario. The amount of time and computational bandwidth required to train a machine-learned component of an autonomous vehicle and the accuracy of the machine-learned component may be improved by determining a reward for performance of the autonomous vehicle in a scenario based at least in part on an severity metric. The impact severity metric may be determined based at least in part on a velocity, angle, and/or interaction area associated with the impact.

20 Claims, 6 Drawing Sheets

AUTOMATED REINFORCEMENT LEARNING SCENARIO VARIATION AND IMPACT PENALTIES

BACKGROUND

Running simulations of scenarios may provide a valuable method for testing autonomous systems and/or machine-learned model pipelines, such as those incorporated in autonomous vehicles. However, human behavior may be unpredictable and it may therefore be difficult to anticipate infrequent anomalous behavior or difficult scenarios. For example, a human driver may suddenly swerve off a highway onto an off-ramp, make a turn in front of oncoming traffic, turn on a red light at an intersection where such a turn is illegal, etc. Moreover, training on simulated scenarios may not be time efficient or result in an efficient vehicle system.

BRIEF DESCRIPTION OF THE DRAWINGS

The detailed description is described with reference to the accompanying figures. In the figures, the left-most digit(s) of a reference number identify the figure in which the reference number first appears. The same reference numbers in different figures indicate similar or identical items.

DETAILED DESCRIPTION

Figure 1:
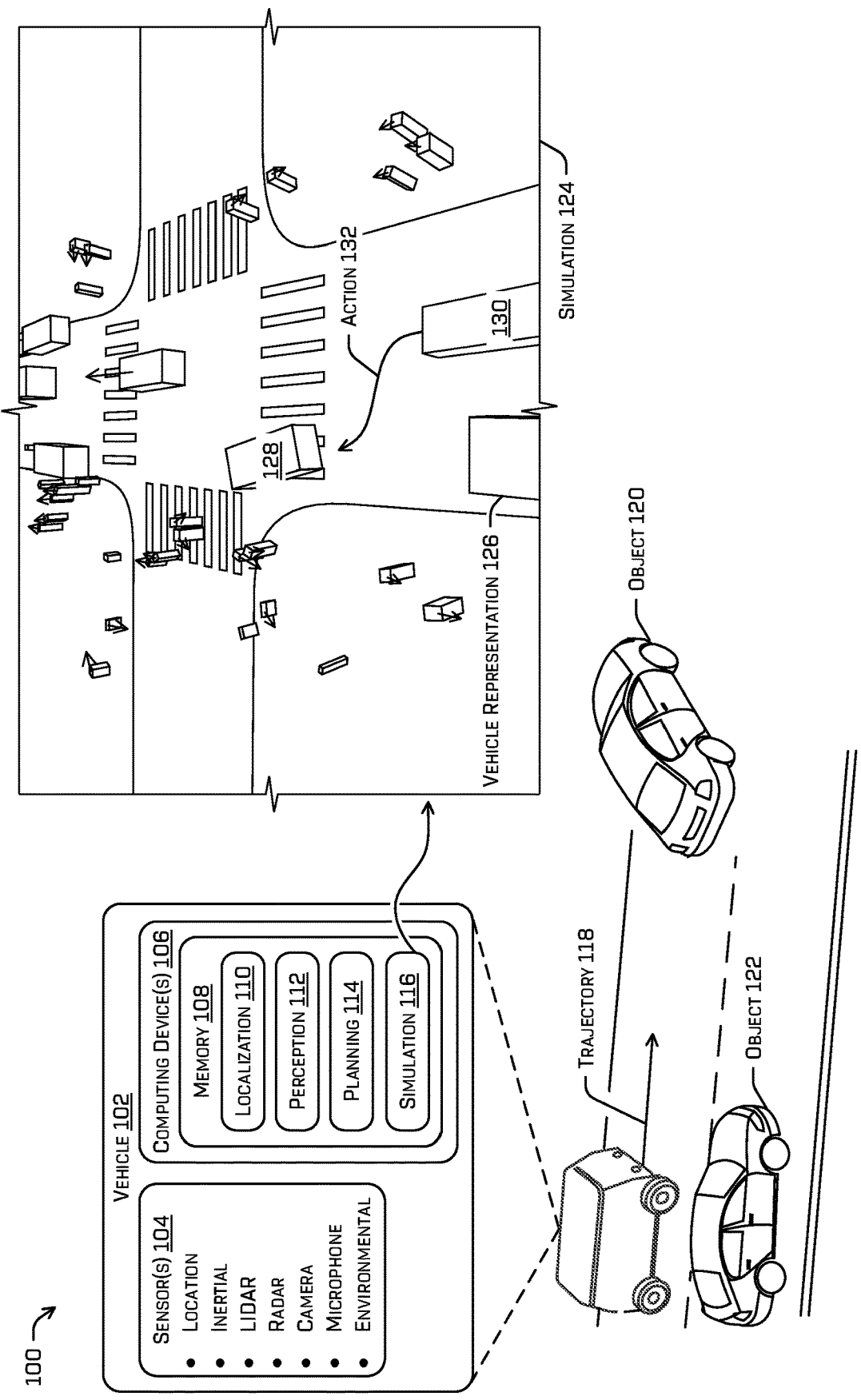
FIG. 1 illustrates an example scenario in which an autonomous vehicle may collect log data that may be used to generate simulated scenarios. The autonomous vehicle may additionally or alternatively be controlled based at least in part on a machine-learned component trained according to the automated reinforcement learning techniques discussed herein.

As discussed above, it may be difficult to prepare an autonomous vehicle for all contingencies because of the occurrence of anomalous behavior and rare scenarios. This problem may be multiplied by the fact that the autonomous vehicle may handle some anomalous behavior and/or rare scenarios well, without any cognizable reason for what differentiates such behavior or scenario from behavior and/or scenarios that the autonomous vehicle doesn't handle well. Moreover, techniques for training an autonomous vehicle to handle various scenarios may be inefficient and/or they may result in poorly trained components. This application relates to techniques for improving the component(s) of an autonomous vehicle by increasing the number of situations the autonomous vehicle can interact with successfully (e.g., safely, without getting stuck or hesitating, by taking a most efficient or logical route). The techniques may also increase the efficiency of the training techniques by reducing repetitious training that is unlikely to further improve the component and by discovering and exploiting latent relations between various types of training to more adequately and quickly train the component.

To increase the number of situations the autonomous vehicle can handle, the techniques may include scoring the autonomous vehicle's performance—determining a performance metric—as it encounters various behaviors and/or scenarios. Determining the performance metric may be based at least in part on a reward determined as part of a reinforcement learning technique for training a component of the autonomous vehicle, although the performance metric may be based on an additional or alternate determinations, such as whether an impact occurred during the simulation, how many impacts occurred, a velocity and/or angle associated with an impact, a percentage of the total simulation that was successfully navigated, a score determined based at least in part on a rule set that may specify a maximum jerk/acceleration, etc. The reward, which may be negative (i.e., a penalty), may be determined based on performance of the autonomous vehicle in real life and/or in a simulation. The reward may be used to alter a machine-learned model such that the machine-learned model is more likely to repeat the behavior that resulted in the reward (or makes behavior that resulted in a penalty less likely to happen). For example, the machine-learned model may be part of a pipeline that generates control instructions for controlling motion of the autonomous vehicle. For simulations those control instructions may be translated by a computer to control simulated motion of a simulated autonomous vehicle. The machine-learned model may be part of any portion of the pipeline, such as part of a perception component that determines what is in the (simulated and/or real) environment, a localization component that determines where the vehicle is in the (simulated and/or real) environment, and/or a planning component that determines the control instructions for controlling motion of the (real and/or simulated) vehicle.

To give an example, a simulation component may instantiate and execute a simulation based on parameters specified by first scenario data (e.g., specifying a particular traffic intersection, traffic control devices, other objects and obstacles and their respective parameters (size, shape, velocity, etc.), and the like). Component(s) of the autonomous vehicle may receive simulated data, such as simulated sensor data and/or simulated perception data, which the component(s) of the autonomous vehicle may use to output control signals for controlling motion of the autonomous vehicle. These control signals may be used to control a simulated representation of the autonomous vehicle in the simulated environment in addition to or instead of controlling the autonomous vehicle in real life—in other words, the simulation may occur while the autonomous vehicle is conducting real-world driving, in response to the autonomous vehicle's real-world driving, or in a completely synthetic environment where the control signals are used to control the simulated representation of the autonomous vehicle exclusively. A performance component that receives a record of how the simulated representation (and/or the real-world autonomous vehicle) was controlled by the autonomous vehicle component(s) may determine a reward based at least in part on how the autonomous vehicle performed in the simulation. This reward (or penalty) may be used to modify a machine-learned component of at least one of the autonomous vehicle components.

The reward may be based at least in part on a variety of operating parameter(s), such as a minimum distance between the vehicle and a nearest object, an acceleration required to avoid impact, a time until impact, a deviation from a route, whether a jerk and/or acceleration by the vehicle met or exceeded a threshold jerk and/or a threshold acceleration, etc. In some examples, the reward may comprise a weighted sum of sub-rewards. In an additional or alternate example, at least one of the sub-rewards may be a regressed value determined by a machine-learned model. For example, the reward output by the machine-learned model may be based at least in part on a predicted likelihood of impact determined by the machine-learned model. Additional or alternate metrics and/or manners of determining such a reward are discussed in further detail in U.S. patent application Ser. No. 17/216,547, filed Mar. 29, 2021, and U.S. patent application Ser. No. 16/953,277, filed Nov. 19, 2020, both of which are incorporated by reference herein for all intents and purposes.

In some examples, the performance metric and/or the reward may be based at least in part on a direction and/or velocity associated with an impact between the autonomous vehicle and an object. For example, the reward may be a penalty that increases as the velocity increases and/or as the direction of impact is within a range of angles—head-on impacts may be more heavily penalized than glancing impacts. Using this graded (i.e., along a gradient) penalty for impacts may cause the reinforcement learning to train the autonomous vehicle to avoid impacts and act naturally without having to use additional reward functions beside an impact reward (penalty) function, thereby reducing the complexity of the reinforcement learning technique. The performance metric may be determined based at least in part on such a reward and may differ from the reward in that the reward may be used to modify a machine-learned component and may be determined according to a reinforcement learning technique, whereas the performance metric may be used to track how the machine-learned component is performing on a scenario and for adjusting the probability that the scenario is selected/determined for simulation. The performance metric may or may not be based at least in part on the reward.

In some examples, the techniques may shorten the time it takes to train the machine-learned component by continuing to execute a simulation after one or more impacts have occurred if the one or more impacts are associated with velocities that do not meet a threshold velocity and/or are associated with an angle outside a range of angles. In some cases, this may allow a more severe penalty to be applied for a more severe impact that may come later in the scenario, which may result in a larger alteration to the machine-learned model than would have been caused by a smaller impact.

The techniques discussed herein may include associating a probability with scenario data that may be used for generating and executing a simulation. Scenario data may specify a configuration, conditions, and/or parameters used by a simulation component to set up and/or run a simulation. For example, the scenario data may identify a pose (e.g., location and/or orientation) of a simulated autonomous vehicle in a simulated environment; a layout and features of the environment; a type, position, orientation, speed, etc. of object(s) in the environment, a grade and/or bank associated with a roadway, kinematic coefficients and/or other characteristics associated with the environment, and/or the like.

The probability associated with scenario data may indicate a probability that that scenario data is determined by a simulation system for simulation. For example, the simulation system may determine a scenario for simulation from among multiple scenarios based on the probabilities associated with the different scenarios, simulate the determined scenario using the scenario data associated therewith, and a performance component may determine the reward/penalty for how the autonomous vehicle performed during the simulation. The performance of the vehicle for that particular determined scenario may be tracked over time. The reward/penalty may be used to determine an aggregate performance of the vehicle over all or a recent range of instances in which the autonomous vehicle performed in a simulation of the scenario.

The performance may be tracked for each scenario over time and the techniques may further include altering a probability associated with a scenario based at least in part on the performance metric associated with the scenario and/or a performance metric associated with another scenario. If the performance metric indicates that the performance of the vehicle for a given scenario is decreasing, the probability associated with that scenario may be increased and vice versa. In some examples, the probabilities associated with the different scenarios may be maintained for an initialization period, such as a thousand, ten thousand, a million, or any other number of scenarios being run; each scenario being run at least a hundred, thousand, or any other number of times, or the like. In some examples, the probabilities may be altered every n number of simulations, where n is a positive integer. In an additional or alternate example, the probability associated with a first scenario may be 0 (or some other value) until the performance metric associated with a second scenario meets or exceeds a threshold performance. For example, the first scenario may be a more complex version of the second scenario. In an additional or alternate example, once the performance metric associated with a scenario meets or exceeds a threshold, a copy of the scenario data associated with that scenario may be made and the complexity of that scenario data may be increased, such as by adding an object, changing a trajectory of an object, changing a starting position or state of the autonomous vehicle, adding a weather condition, and/or the like. In such an example, both scenarios may exist after the scenario data is copied and made more complex or otherwise perturbed. In some examples, the probability associated with the newly-created scenario data may be greater than a probability associated with the scenario from which the newly-created scenario was copied.

The techniques discussed herein may further include controlling a simulated object in the simulation by randomizing the instructions that control movement of the simulated object. This randomization may be bounded by a maximum jerk, maximum acceleration, or maximum steering rate in order to keep the randomization within possibility and to prevent the simulated object's movements from being impossibly difficult for the autonomous vehicle or even a human to avoid an impact. This randomization may be used periodically or may be specified as being active by scenario data. In other words, the scenario data may specify a number of objects that are randomly controlled rather than following a particular trajectory. This number of objects may be zero or more. This randomization may result in the machine-learned component of the autonomous vehicle to learn good behavior without needing to introduce complex reward functions. For example, good behavior may be behavior that is similar to, better than, or the same as human behavior in a same scenario and may include avoiding an impact, following rules of the road, and/or the like.

In some examples, controlling a simulated object using random instructions may allow the reinforcement learning techniques discussed herein to employ a single reward function that penalizes impacts (or other specific events). In some examples, additional reward functions may be used, such as penalizing a maximum acceleration and/or jerk above a threshold acceleration and/or jerk. This vastly simplifies reinforcement learning since reward functions for a multitude of situations do not need to be developed, such as a multitude of reward functions for conforming to different rules of the road; how to handle pedestrians, animals, trash, or other non-vehicle objects that the vehicle might encounter; how to handle double-parked vehicles; and/or the like.

In some examples, the techniques may additionally or alternatively include determining a scenario label to associate with scenario data that generalizes the scenario or a task the autonomous vehicle is to accomplish, such as "four-way junction," "right unprotected turn," or the like. The techniques may include training generalized training where a single machine-learned model is trained to handle many different (or all) scenarios, i.e., using scenario data associated with multiple scenario labels, or the techniques may include specialized training that trains separate machine-learned models to handle different scenarios associated with different scenario labels, i.e., using singular or limited scenario labels (e.g., where limited scenario labels might include the scenario labels of a same category of scenario labels, such as "turns," "junctions," "protected turns," or the like).

The techniques discussed herein may be used to test operation of an autonomous vehicle (e.g., a planning component of an autonomous vehicle), which may generate a trajectory for controlling operation of the autonomous vehicle based at least in part on simulated sensor data associated with the simulated motion of an agent. The perception data produced by the perception component based on simulated sensor data may also be provided to the planning component for testing the planning component. In some examples, the techniques used herein may be used to validate a version of a component of the autonomous vehicle and, upon successful completion of a specified number, percentage, and/or type of scenarios, the component may be updated to the version (e.g., by updating software, swapping out and/or adding hardware).

The techniques may improve the testing and/or training of one or more components of the autonomous vehicle (e.g., a localization component, a perception component, a planning component) and may thereby improve the accuracy thereof and the safety and efficacy of operation of the autonomous vehicle (or any other system that integrates such a perception component and/or planning component) by increasing the recall of a machine-learned component of the autonomous vehicle and/or the number of scenarios that the autonomous vehicle can safely and efficiently navigate. These techniques may also reduce the training time and/or number of computational cycles required to train a component of the autonomous vehicle to be able to handle a particular number of scenarios.

Example Scenario

FIG. 1 illustrates an example scenario 100 including a vehicle 102. In some examples, the example scenario 100 may be a real-world scenario and/or the example scenario 100 may be a representation of a real-world scenario modeled as a simulated scenario. In examples where the example scenario 100 is a simulated scenario, the example scenario 100 may be determined based at least in part on input received at a user interface of a computing device (e.g., a user of the computing device may define the environment, objects therein, and/or characteristics thereof) and/or the example scenario 100 may be based at least in part on log data received from one or more autonomous vehicles (i.e., data captured and stored during actual driving in a physical environment including raw sensor data and data derived therefrom including detections, predictions, control signals, etc.). The log data may be based at least in part on sensor data received at an autonomous vehicle, perception data generated by a perception component, and/or instructions generated by a planning component. In some examples, the autonomous vehicle may store the log data and/or periodically transmit the log data to a remote computing device.

In some instances, the vehicle 102 may be an autonomous vehicle configured to operate according to a Level 5 classification issued by the U.S. National Highway Traffic Safety Administration, which describes a vehicle capable of performing all safety-critical functions for the entire trip, with the driver (or occupant) not being expected to control the vehicle at any time. However, in other examples, the vehicle 102 may be a fully or partially autonomous vehicle having any other level or classification. It is contemplated that the techniques discussed herein may apply to more than robotic control, such as for autonomous vehicles. For example, the techniques discussed herein may be applied to mining, manufacturing, augmented reality, etc. Moreover, even though the vehicle 102 is depicted as a land vehicle, vehicle 102 may be a spacecraft, watercraft, and/or the like. In some examples, vehicle 102 may be represented in a simulation as a simulated vehicle. For simplicity, the discussion herein does not distinguish between a simulated vehicle and a real-world vehicle. References to a "vehicle" may therefore reference a simulated and/or a real-world vehicle.

According to the techniques discussed herein and an example where scenario 100 is a real-world example, the vehicle 102 may receive sensor data from sensor(s) 104 of the vehicle 102. For example, the sensor(s) 104 may include a location sensor (e.g., a global positioning system (GPS) sensor), an inertia sensor (e.g., an accelerometer sensor, a gyroscope sensor, etc.), a magnetic field sensor (e.g., a compass), a position/velocity/acceleration sensor (e.g., a speedometer, a drive system sensor), a depth position sensor (e.g., a lidar sensor, a radar sensor, a sonar sensor, a time of flight (ToF) camera, a depth camera, and/or other depth-sensing sensor), an image sensor (e.g., a camera), an audio sensor (e.g., a microphone), and/or environmental sensor (e.g., a barometer, a hygrometer, etc.). In some examples, a simulated sensor may correspond with at least one of the sensor(s) 104 on the vehicle 102 and in a simulation, one or more of sensor(s) 104 may be simulated. In some examples, the position of a simulated sensor may correspond with a relative position of one of the sensor(s) 104 to the vehicle 102.

The sensor(s) 104 may generate sensor data, which may be received by computing device(s) 106 associated with the vehicle 102. However, in other examples, some or all of the sensor(s) 104 and/or computing device(s) 106 may be separate from and/or disposed remotely from the vehicle 102 and data capture, processing, commands, and/or controls may be communicated to/from the vehicle 102 by one or more remote computing devices via wired and/or wireless networks.

Computing device(s) 106 may comprise a memory 108 storing a localization component 110, a perception component 112, a planning component 114, and/or a simulation component 116. In general, localization component 110 may comprise software and/or hardware system(s) for determining a pose (e.g., position and/or orientation) of the vehicle 102 relative to one or more coordinate frames (e.g., relative to the environment, relative to a roadway, relative to an inertial direction of movement associated with the autonomous vehicle). The localization component 110 may output at least part of this data to the perception component 112, which may output at least some of the localization data and/or use the localization data as a reference for determining at least some of the perception data.

The perception component 112 may determine what is in the environment surrounding the vehicle 102 and may include a prediction component that predicts a state of detected object(s) and/or of the environment. The planning component 114 may determine how to operate the vehicle 102 according to information received from the localization component 110 and/or the perception component 112. The localization component 110, the perception component 112, and/or the planning component 114 may include one or more machine-learned (ML) models and/or other computer-executable instructions.

In some examples, the localization component 110 and/or the perception component 112 may receive sensor data from the sensor(s) 104 and/or simulated data from simulation component 116. The techniques discussed herein may comprise adding simulation data received from the simulation component 116 to perception data output by the perception component 112, thereby improving the online prediction of possible agent behaviors. For example, the simulation component 116 may generate modified maneuvers and/or modified paths using the agent behavior model(s) discussed herein and provide the modified maneuvers and/or modified paths the planning component 114 and/or the perception component 112 in at least one example.

In some instances, the perception component 112 may determine data related to objects in the vicinity of the vehicle 102 (e.g., classifications associated with detected objects, instance segmentation(s), tracks), route data that specifies a destination of the vehicle, global map data that identifies characteristics of roadways (e.g., features detectable in different sensor modalities useful for localizing the autonomous vehicle), local map data that identifies characteristics detected in proximity to the vehicle (e.g., locations and/or dimensions of buildings, trees, fences, fire hydrants, stop signs, and any other feature detectable in various sensor modalities), etc. In some examples, the objects surrounding the vehicle 102 may be simulated objects of a simulated environment. The data produced by the perception component 112 may be collectively referred to as "perception data." Once the perception component 112 has generated perception data, the perception component 112 may provide the perception data to the planning component 114.

In some examples, prediction data determined by the perception component 112 may be additionally or alternatively based at least in part on map data or other data. In some examples, the prediction data may comprise a top-down segmentation of the environment, as described in more detail in U.S. patent application Ser. No. 15/963,833, which is incorporated by reference in its entirety herein for all purposes, and/or a top-down prediction associated with the environment, as described in more detail in U.S. patent application Ser. No. 16/779,576, which is incorporated by reference in its entirety herein for all purposes. The map data map be stored by memory 108. In some examples, the prediction data and/or other perception data may be stored as part of log data.

The planning component 114 may determine trajectory 118 based at least in part on the perception data and/or other information such as, for example, simulation data generated by the simulation component 116 and/or localization data (e.g., where the vehicle 102 is in the environment relative to a map and/or features detected by the perception component 112). For example, the planning component 114 may determine a route for the vehicle 102 from a first location to a second location; generate, substantially simultaneously and based at least in part on the perception data and/or the simulated perception data, a plurality of potential trajectories for controlling motion of the vehicle 102 in accordance with a receding horizon technique (e.g., 1 micro-second, half a second) to control the vehicle to traverse the route (e.g., in order to avoid any of the detected objects); and select one of the potential trajectories as a trajectory 118 that the vehicle 102 may use to generate a drive control signal that may be transmitted to drive components of the vehicle 102.

FIG. 1 depicts an example of such a trajectory 118, represented as an arrow indicating a heading, velocity, and/or acceleration, although the trajectory itself may comprise a command and/or target (future) state of the vehicle 102, which may, in turn, actuate a drive system of the vehicle 102. For example, the trajectory 118 may comprise instructions for controller(s) of the autonomous vehicle 102 to actuate drive components of the vehicle 102 to effectuate a steering angle and/or steering rate, which may result in a vehicle position, vehicle velocity, and/or vehicle acceleration (or a simulated version thereof when the autonomous vehicle is being simulated) to track the command and/or target state. The trajectory 118 may comprise a target heading, target steering angle, target steering rate, target position, target velocity, and/or target acceleration for the controller(s) to track.

The example scenario 100 includes object 120 and object 122, both of which are vehicles in the illustrated example, although it's contemplated that the environment could include anything encountered in real-world scenarios. In an example where the simulation component 116 is running on the vehicle during operation of the vehicle, the perception component 112 may receive sensor data associated with the environment and determine a position, orientation, velocity, classification (e.g., vehicle, sedan, "passenger vehicle"), track (e.g., historical, current, and/or predicted attributes, such as position, orientation, velocity, etc.), etc. of the object 120 and/or object 122. Perception data generated by the perception component 112 and/or sensor data may be stored in a log data store, which may comprise the position and/or other attributes of object 120 and/or object 122 at a current, previous, and/or future time steps, where the future time steps may be associated with predicted data. Each time step may correspond to an interval of time (e.g., 100 milliseconds, 500 milliseconds, 1 second, any other portion of time). Additionally or alternatively, the simulation component 116 may run/be part of a remote computing device and/or during an offline procedure when the vehicle isn't nominally operating (e.g., the autonomous vehicle isn't in a ride-hailing mode, the autonomous vehicle is in a development mode, the autonomous vehicle is stopped), as discussed in more detail in reference to the following figure. In some examples, the sensor data may be simulated or the sensor data may be replayed from log data.

Regardless, the simulation component 116 may execute a simulation based at least in part on the sensor data, perception data, and/or log data (e.g., log data may be used in instances where the simulation is being run as part of a replay and/or where executing the simulation may be based on historical data, such as to improve the accuracy of predicted behavior of simulated objects). The log data may comprise the sensor data, perception data, planning data, etc.

In other words, the log data may comprise the sensor data and any other data generated by the vehicle responsive to the sensor data. In an instance where the simulation component 116 is running on-vehicle and while the vehicle is operating, the simulation component 116 may be used to improve prediction of how dynamic (e.g., moving, changing) objects will behave and/or how their states will change in the future. Regardless of whether the simulation is running on-vehicle or not, or during normative operation or not, the simulation component 116 may determine a simulation 124 of the environment and/or the objects therein.

In some examples, executing the simulation 124 may include instantiating a (simulated) scenario comprising a simulated environment and/or simulated object(s) therein based at least in part on the sensor data, perception data, log data, scenario data, and/or control instructions (e.g., the control instructions may be output by the planning component 114 for controlling the vehicle 102 and, as regards the simulation, the control instructions may be used to control motion of a simulated representation of the vehicle 102, vehicle representation 126). The illustrated simulation 124 also comprises representations of object 120 and object 122, representation 128 and representation 130, respectively, including an action 132 being executed by representation 130 (i.e., cutting into a lane containing vehicle representation 126).

The techniques discussed herein may comprise instantiating a simulation based on determining scenario data to simulate from among multiple scenarios based at least in part on a probability associated with the scenario data. The scenario data may be generated from log data, user input, and/or it may be procedurally generated. In some examples, the scenario data may include all three or a combination thereof (e.g., log data may be used as the basis of first scenario data, copied to second scenario data which may be procedurally modified or modified by a user, and/or the like). In some examples, the simulation may be used to train a machine-learned component of the localization component 110, perception component 112, planning component 114, and/or any other component of the autonomous vehicle. In at least one example, the simulation may be used to train the planning component 114. In some examples, the simulation component 116 may control motion of simulated object according to scenario data and/or log data. Controlling these objects may include controlling a simulated object with randomized instructions bounded by limits specifying a maximum acceleration, maximum steering rate, and/or the like. In some examples, the simulation component 116 or another component may determine the reward (or penalty) that may be used to tune the machine-learned component.

The vehicle 102 may transmit at least part of the sensor data, perception data, and/or a scenario label (if one is generated on-vehicle by the perception component 112) as part of the log data to a remote computing device (unillustrated in FIG. 1). In some examples, a scenario label may be associated with a portion of the log data and that scenario label may be determined by the perception component 112 and/or by a remote computing device.

Example System

Figure 2:
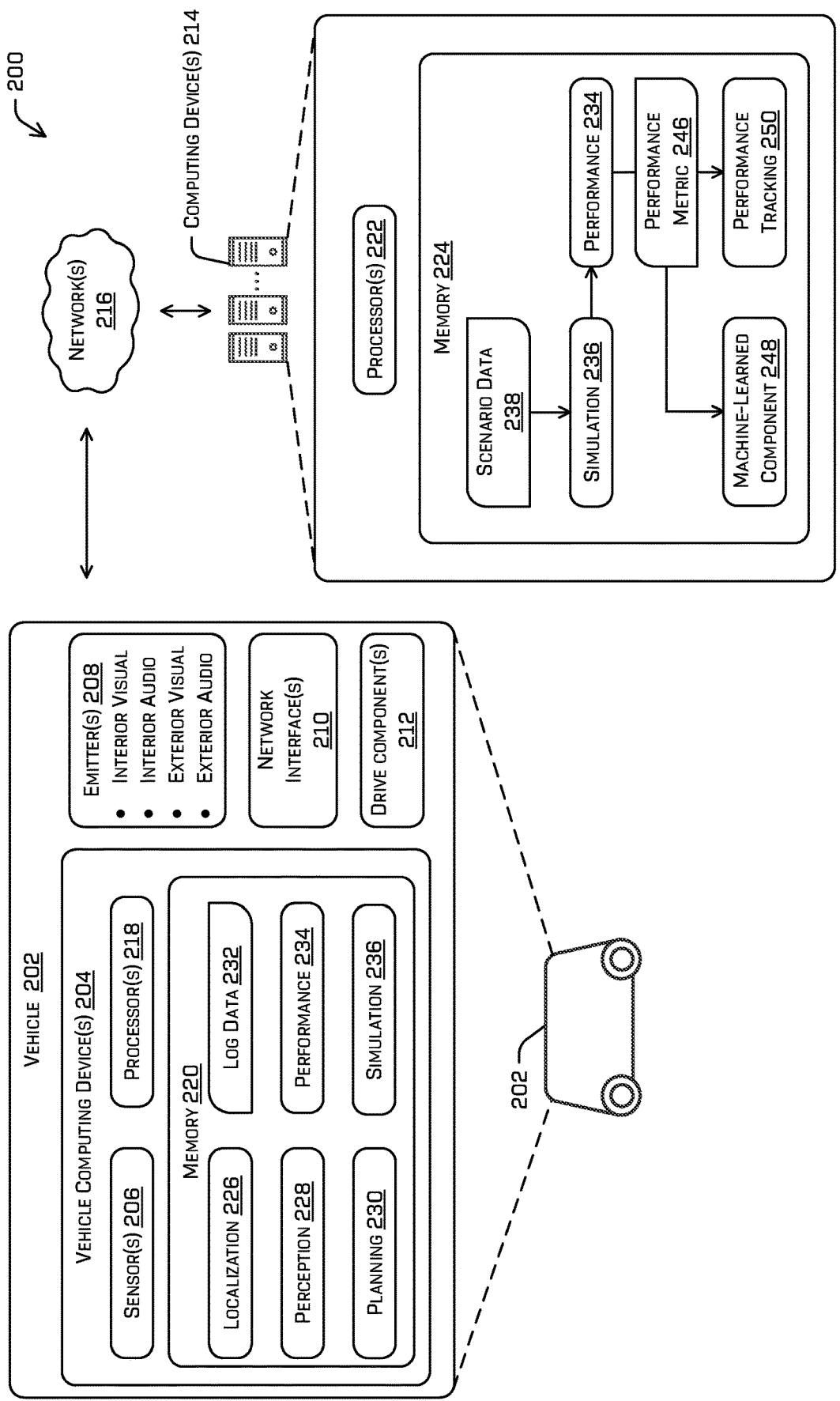
FIG. 2 illustrates a block diagram of an example architecture for generating and executing a simulation of a scenario and using the reinforcement learning techniques discussed herein to train and/or improve a machine-learned component of an autonomous vehicle.

FIG. 2 illustrates a block diagram of an example system 200 that implements the techniques discussed herein. In some instances, the example system 200 may include a vehicle 202, which may represent the vehicle 102 in FIG. 1. In some instances, the vehicle 202 may be an autonomous vehicle configured to operate according to a Level 5 classification issued by the U.S. National Highway Traffic Safety Administration, which describes a vehicle capable of performing all safety-critical functions for the entire trip, with the driver (or occupant) not being expected to control the vehicle at any time. However, in other examples, the vehicle 202 may be a fully or partially autonomous vehicle having any other level or classification. Moreover, in some instances, the techniques described herein may be usable by non-autonomous vehicles as well.

The vehicle 202 may include a vehicle computing device(s) 204, sensor(s) 206, emitter(s) 208, network interface(s) 210, and/or drive component(s) 212. Vehicle computing device(s) 204 may represent computing device(s) 106 and sensor(s) 206 may represent sensor(s) 104. The system 200 may additionally or alternatively comprise computing device(s) 214.

In some instances, the sensor(s) 206 may represent sensor(s) 104 and may include lidar sensors, radar sensors, ultrasonic transducers, sonar sensors, location sensors (e.g., global positioning system (GPS), compass, etc.), inertial sensors (e.g., inertial measurement units (IMUs), accelerometers, magnetometers, gyroscopes, etc.), image sensors (e.g., red-green-blue (RGB), infrared (IR), intensity, depth, time of flight cameras, etc.), microphones, wheel encoders, environment sensors (e.g., thermometer, hygrometer, light sensors, pressure sensors, etc.), etc. The sensor(s) 206 may include multiple instances of each of these or other types of sensors. For instance, the radar sensors may include individual radar sensors located at the corners, front, back, sides, and/or top of the vehicle 202. As another example, the cameras may include multiple cameras disposed at various locations about the exterior and/or interior of the vehicle 202. The sensor(s) 206 may provide input to the vehicle computing device(s) 204 and/or to computing device(s) 214. In some examples, the simulated sensors discussed herein may correspond to a specific type of sensor and/or any of the sensors. The position associated with a simulated sensor, as discussed herein, may correspond with a position and/or point of origination of a field of view of a sensor (e.g., a focal point) relative the vehicle 202 and/or a direction of motion of the vehicle 202.

The vehicle 202 may also include emitter(s) 208 for emitting light and/or sound, as described above. The emitter(s) 208 in this example may include interior audio and visual emitter(s) to communicate with passengers of the vehicle 202. By way of example and not limitation, interior emitter(s) may include speakers, lights, signs, display screens, touch screens, haptic emitter(s) (e.g., vibration and/or force feedback), mechanical actuators (e.g., seatbelt tensioners, seat positioners, headrest positioners, etc.), and the like. The emitter(s) 208 in this example may also include exterior emitter(s). By way of example and not limitation, the exterior emitter(s) in this example include lights to signal a direction of travel or other indicator of vehicle action (e.g., indicator lights, signs, light arrays, etc.), and one or more audio emitter(s) (e.g., speakers, speaker arrays, horns, etc.) to audibly communicate with pedestrians or other nearby vehicles, one or more of which comprising acoustic beam steering technology.

The vehicle 202 may also include network interface(s) 210 that enable communication between the vehicle 202 and one or more other local or remote computing device(s). For instance, the network interface(s) 210 may facilitate communication with other local computing device(s) on the vehicle 202 and/or the drive component(s) 212. Also, the network interface(s) 210 may additionally or alternatively allow the vehicle to communicate with other nearby computing device(s) (e.g., other nearby vehicles, traffic signals, etc.). The network interface(s) 210 may additionally or alternatively enable the vehicle 202 to communicate with computing device(s) 214. In some examples, computing device(s) 214 may comprise one or more nodes of a distributed computing system (e.g., a cloud computing architecture).

The network interface(s) 210 may include physical and/or logical interfaces for connecting the vehicle computing device(s) 204 to another computing device or a network, such as network(s) 216. For example, the network interface(s) 210 may enable Wi-Fi-based communication such as via frequencies defined by the IEEE 802.11 standards, short range wireless frequencies such as Bluetooth®, cellular communication (e.g., 2G, 3G, 4G, 4G LTE, 5G, etc.) or any suitable wired or wireless communications protocol that enables the respective computing device to interface with the other computing device(s). In some instances, the vehicle computing device(s) 204 and/or the sensor(s) 206 may send sensor data, via the network(s) 216, to the computing device(s) 214 at a particular frequency, after a lapse of a predetermined period of time, in near real-time, etc.

In some instances, the vehicle 202 may include one or more drive components 212. In some instances, the vehicle 202 may have a single drive component 212. In some instances, the drive component(s) 212 may include one or more sensors to detect conditions of the drive component(s) 212 and/or the surroundings of the vehicle 202. By way of example and not limitation, the sensor(s) of the drive component(s) 212 may include one or more wheel encoders (e.g., rotary encoders) to sense rotation of the wheels of the drive components, inertial sensors (e.g., inertial measurement units, accelerometers, gyroscopes, magnetometers, etc.) to measure orientation and acceleration of the drive component, cameras or other image sensors, ultrasonic sensors to acoustically detect objects in the surroundings of the drive component, lidar sensors, radar sensors, etc. Some sensors, such as the wheel encoders may be unique to the drive component(s) 212. In some cases, the sensor(s) on the drive component(s) 212 may overlap or supplement corresponding systems of the vehicle 202 (e.g., sensor(s) 206).

The drive component(s) 212 may include many of the vehicle systems, including a high voltage battery, a motor to propel the vehicle, an inverter to convert direct current from the battery into alternating current for use by other vehicle systems, a steering system including a steering motor and steering rack (which may be electric), a braking system including hydraulic or electric actuators, a suspension system including hydraulic and/or pneumatic components, a stability control system for distributing brake forces to mitigate loss of traction and maintain control, an HVAC system, lighting (e.g., lighting such as head/tail lights to illuminate an exterior surrounding of the vehicle), and one or more other systems (e.g., cooling system, safety systems, onboard charging system, other electrical components such as a DC/DC converter, a high voltage junction, a high voltage cable, charging system, charge port, etc.). Additionally, the drive component(s) 212 may include a drive component controller which may receive and preprocess data from the sensor(s) and to control operation of the various vehicle systems. In some instances, the drive component controller may include one or more processors and memory communicatively coupled with the one or more processors. The memory may store one or more components to perform various functionalities of the drive component(s) 212. Furthermore, the drive component(s) 212 may also include one or more communication connection(s) that enable communication by the respective drive component with one or more other local or remote computing device(s).

The vehicle computing device(s) 204 may include processor(s) 218 and memory 220 communicatively coupled with the one or more processors 218. Memory 220 may represent memory 108. Computing device(s) 214 may also include processor(s) 222, and/or memory 224. The processor(s) 218 and/or 222 may be any suitable processor capable of executing instructions to process data and perform operations as described herein. By way of example and not limitation, the processor(s) 218 and/or 222 may comprise one or more central processing units (CPUs), graphics processing units (GPUs), integrated circuits (e.g., application-specific integrated circuits (ASICs)), gate arrays (e.g., field-programmable gate arrays (FPGAs)), and/or any other device or portion of a device that processes electronic data to transform that electronic data into other electronic data that may be stored in registers and/or memory.

Memory 220 and/or 224 may be examples of non-transitory computer-readable media. The memory 220 and/or 224 may store an operating system and one or more software applications, instructions, programs, and/or data to implement the methods described herein and the functions attributed to the various systems. In various implementations, the memory may be implemented using any suitable memory technology, such as static random access memory (SRAM), synchronous dynamic RAM (SDRAM), nonvolatile/Flash-type memory, or any other type of memory capable of storing information. The architectures, systems, and individual elements described herein may include many other logical, programmatic, and physical components, of which those shown in the accompanying figures are merely examples that are related to the discussion herein.

In some instances, the memory 220 and/or memory 224 may store a localization component 226, perception component 228, planning component 230, log data 232, performance component 234, and/or simulation component 236—zero or more portions of any of which may be hardware, such as GPU(s), CPU(s), and/or other processing units. Localization component 226 may represent localization component 110, perception component 228 may represent perception component 112, planning component 230 may represent planning component 114, and simulation component 236 may represent simulation component 116.

In at least one example, the localization component 226 may include hardware and/or software to receive data from the sensor(s) 206 to determine a position, velocity, and/or orientation of the vehicle 202 (e.g., one or more of an x-, y-, z-position, roll, pitch, or yaw). For example, the localization component 226 may include and/or request/receive map(s) of an environment and can continuously determine a location, velocity, and/or orientation of the autonomous vehicle within the map(s). In some instances, the localization component 226 may utilize SLAM (simultaneous localization and mapping), CLAMS (calibration, localization, and mapping, simultaneously), relative SLAM, bundle adjustment, non-linear least squares optimization, and/or the like to receive image data, lidar data, radar data, IMU data, GPS data, wheel encoder data, and the like to accurately determine a location, pose, and/or velocity of the autonomous vehicle. In some instances, the localization component 226 may provide data to various components of the vehicle 202 to determine an initial position of an autonomous vehicle for generating a trajectory and/or for generating map data, as discussed herein. In some examples, localization component 226 may provide, to the perception component 228, a location and/or orientation of the vehicle 202 relative to the environment and/or sensor data associated therewith.

In some instances, perception component 228 may comprise a primary perception system and/or a prediction system implemented in hardware and/or software. The perception component 228 may detect object(s) in in an environment surrounding the vehicle 202 (e.g., identify that an object exists), classify the object(s) (e.g., determine an object type associated with a detected object), segment sensor data and/or other representations of the environment (e.g., identify a portion of the sensor data and/or representation of the environment as being associated with a detected object and/or an object type), determine characteristics associated with an object (e.g., a track identifying current, predicted, and/or previous position, heading, velocity, and/or acceleration associated with an object), and/or the like. The perception component 228 may include a prediction component that predicts actions/states of dynamic components of the environment, such as moving objects. In some examples, the perception component 228 may include the simulation component 236 as part of the prediction portion of the perception component 228. Data determined by the perception component 228 is referred to as perception data.

The planning component 230 may receive a location and/or orientation of the vehicle 202 from the localization component 226 and/or perception data from the perception component 228 and may determine instructions for controlling operation of the vehicle 202 based at least in part on any of this data. In some examples, determining the instructions may comprise determining the instructions based at least in part on a format associated with a system with which the instructions are associated (e.g., first instructions for controlling motion of the autonomous vehicle may be formatted in a first format of messages and/or signals (e.g., analog, digital, pneumatic, kinematic, such as may be generated by system controller(s) of the drive component(s) 212)) that the drive component(s) 212 may parse/cause to be carried out, second instructions for the emitter(s) 208 may be formatted according to a second format associated therewith). In some examples, where the planning component 230 may comprise hardware/software-in-a-loop in a simulation (e.g., for testing and/or training the planning component 230), the planning component 230 may generate instructions which may be used to control a simulated vehicle. These instructions may additionally or alternatively be used to control motion of a real-world version of the vehicle 202, e.g., in instances where the vehicle 202 runs the simulation component 236 runs on vehicle during operation. The planning component 230 may provide input to the simulation component 236 in some examples (e.g., to control a simulated representation of the vehicle 202 in a simulation executed by the simulation component 236).

The log data 232 may comprise sensor data, perception data, and/or scenario labels determined by the vehicle 202 (e.g., by the perception component 228), as well as any other message generated and or sent by the vehicle 202 during operation including, but not limited to, control messages, error messages, etc. In some examples, the vehicle 202 may transmit the log data 232 to the computing device(s) 214. The vehicle 202 and/or the computing device(s) 214 may execute a pre-processing operation that include identifying different scenarios in the log data and/or perception data associated therewith. A scenario label may identify a layout of the environment (e.g., four-way controlled intersection, three-way uncontrolled intersection, six-way atypical controlled intersection, two-lane highway, one-way direction of travel); a number, type, and/or configuration of objects in the scenario; an environmental condition (e.g., weather state, smoke); a trajectory associated with an object, which may include a velocity of the object at different points; a mission of the vehicle (e.g., park, change lanes, turn, proceed through junction, stay in lane, a path or route for the vehicle to follow or seek to follow); and/or the like. The configuration may identify a position, orientation, and/or trajectory/velocity of the objects. The techniques may comprise aggregating the log data and perception data associated with a same scenario from log data and perception data received from one or more autonomous vehicles over a data-gathering time period.

In some examples, the computing device(s) 214 may identify one or more scenarios based at least in part on the log data or as otherwise specified, which may also comprise defining a scenario. For example, the computing device(s) 214 may determine an environmental layout, a number, type, and a configuration of object(s) in the environment and/or associate this definition with one or more portions of log data associated with that scenario. In some examples, the log data 232 may comprise (historical) perception data that was generated on the vehicle 102 during operation of the vehicle. In an additional or alternate example, the perception data may include perception data generated during a simulation. In some examples, the scenario may indicate characteristics of the environment such as, for example, a position, orientation, movement, and/or characteristics (e.g., materials, height, width, depth, luminance, reflectance, etc.) of one or more objects. For example, the environment may comprise one or more static objects and/or one or more agents (e.g., dynamic objects) in a configuration specified by the scenario that is to be simulated. In some examples, any of the dynamic objects instantiated in the scenario may be controlled based at least in part on the output of a simulation component 236 that randomizes instructions for controlling the dynamic object and/or controls the dynamic object according to a path specified by scenario data.

In some examples, a scenario label may be determined and associated with sensor data and/or perception data stored as part of the log data. The scenario label may characterize a number, type, or configuration of objects in the environment; a layout of the environment; and/or environmental state(s). In some examples, the scenario label may be a data structure. The configuration may define a position, heading, and/or velocity of an object in the environment and the layout of the environment may identify a general characterization of the environment (e.g., four-way light controlled intersection, four-way light-controlled intersection with uncontrolled left turn lane, three-way uncontrolled intersection with one-way road). In some examples, a scenario label may be generated as part of a log data processing operation. The processing operation may comprise determining sensor data associated with perception data that identifies a relative location and/or type of object. For example, the processing operation may identify a number and/or type of objects in the regions enumerated below and associating this data with the respective sensor data. The resulting metadata annotations may be clustered and a scenario label may be associated with each disparate cluster, which may be based on number and/or type of object and/or region. In some examples, clustering the metadata annotations may comprise using a Naïve Bayes classifier, embedding algorithm, and/or support vector machine to determine keywords that may be similar to each other/associated with a same cluster. For other forms of data, such as a distance from a junction, a traffic light state, or a number of roadways associated with a junction, k-means may additionally or alternatively be used. In some examples, the clustering may be based at least in part on region in which an object exists relative to the vehicle 202. The regions may include, for example:

- in front of the vehicle 202,
- to a side of the vehicle 202,
- behind the vehicle 202,
- in a lane over from a lane of the vehicle 202,
- in a next further lane from the vehicle 202,
- in or near a variety of intersection/junction configurations (e.g., at a four-way controlled intersection; in a T-junction; at a 4-way, 2 controlled, 2 uncontrolled intersection),
- next to a roadway, etc.

In some examples, the scenario label may not be humanly comprehensible—the scenario label may merely be a cluster identifier—although in other examples, humanly comprehensible terms may be attached to the clusters (e.g., two objects to side of vehicle, one object in front of vehicle), trained embeddings, and the like.

The simulation component 236 may operate on the vehicle 202 and/or on the computing device(s) 214. If the simulation component 236 is operating on the vehicle, the simulation component 236 may be used to improve a machine-learned component of the vehicle 202 during real-world operation of the vehicle. The simulation component 236 may run parallel to the perception component 228 and/or the simulation component 236 may be part of the perception component 228. At least some components of the perception component 228 may provide their outputs to the simulation component 236. The simulation component 236 may determine a simulation of the environment and/or the vehicle 202. For example, the simulation may comprise a representation of a position, orientation, movement, and/or quality of portions of the environment and/or the vehicle 202. The environment may comprise an agent, such as another vehicle, a pedestrian, vegetation, a building, signage, and/or the like. Simulation may be used to test operation of various components of the vehicle 202. In some examples, simulation may be used to test the perception component 228 and/or the planning component 230 of the autonomous vehicle based at least in part on providing data from the simulation component 236 to the perception component 228 and/or the planning component 230 and the simulation component 236 receiving outputs from the perception component 228 and/or the planning component 230. Output received from the planning component 230 by the simulation component 236 may be used to control simulated actions of a simulated representation of vehicle 202 in the simulation.

In an additional or alternate example, such as when the simulation component 236 is being executed on computing device(s) 214, the simulation component 236 may receive scenario data 238 to determine the simulation, which may be a two or three-dimensional representation of the scenario. The scenario data 238 may identify a layout of the environment; a number, type, and/or configuration of objects in the scenario; an environmental condition; a trajectory associated with an object, which may identify a velocity and/or heading of the object at different points; a mission for the vehicle (e.g., park, change lanes, turn, proceed through junction, stay in lane); and/or the like. In some examples, the scenario data 238 may comprise a two-dimensional representation of an environment associated with a scenario, objects contained therein, and characteristics associated therewith, all of which may be part of a scenario associated with the log data. For example, the scenario data may identify a position of an object, an area occupied by the object, a velocity and/or acceleration associated with the object, whether the object is static or dynamic, an object type associated with the object (e.g., a classification such as "pedestrian," "bicyclist," "vehicle," "oversized vehicle," "traffic light," "traffic signage," "building," "roadway," "crosswalk," "sidewalk"), and/or other kinematic qualities associated with the object and/or the object type (e.g., a friction coefficient, an elasticity, a malleability). As regards the environment itself, the scenario data may identify a topology of the environment, weather conditions associated with the environment, a lighting state (e.g. sunny, cloudy, night), a location of light sources, and/or the like. In some examples, topology, fixed object (e.g., buildings, trees, signage) locations and dimensions, and/or the like associated with the scenario data may be generated based at least in part on map(s).

In some examples, the scenario data 238 may be procedurally generated as part of a combinatorial iteration through scenarios, received responsive to interaction with a user interface of the computing device(s) 214 (e.g., responsive to user input), and/or the like, although in at least one example, the scenario data 238 may be at least partially defined by a scenario associated with the log data. In other words, in some examples, the scenario data 238 may be generated from log data. In some examples, the scenario data 238 generated from log data may be used as is and/or it may be modified by a procedural technique that modifies the difficulty of the scenario data, such as by copying the scenario data 238 to form new scenario data and adding, removing, and/or modifying objects, a type of an object, weather conditions, the configuration of the scenario, paths of an object, a mission of the vehicle 202, and/or the like to increase the variation of scenarios represented by all the scenario data.

In some examples, the scenario data 238 may be used (e.g., by the simulation component 236) to instantiate a three-dimensional representation of the object and/or the simulated environment may be instantiated based at least in part on map data (e.g., which may define a topology of the environment; the location and/or dimensions of fixtures such as signage, plants, and/or buildings) and/or the scenario data 238. A three-dimensional representation may comprise position, orientation, geometric data (e.g., a polygon representation, a digital wire mesh representation) and/or movement data associated with one or more objects of the environment and/or may include material, lighting, and/or lighting data, although in other examples this data may be left out. A two-dimensional representation may include a top-down representation of the scenario, in some examples. The instantiation may comprise initializing a location, heading, and/or velocity of a simulation of the vehicle 202 in the simulated environment.

In some examples, any amount of the vehicle 202 may be simulated, from a single component, a few of the components, or the entirety of the vehicle 202. In some examples, a simulated sensor may determine sensor data based at least in part on a simulation executed by the simulation component 236. For example, U.S. patent application Ser. No. 16/581,632, filed Sep. 24, 2019 and incorporated herein by reference in its entirety and for all purposes, discusses this in more detail. In an additional or alternate example, the simulation executed by the simulation component may itself comprise simulated sensor data. The perception component 228 (e.g., a copy thereof, which may comprise software and/or hardware, which may include hardware-in-the loop simulation) may receive such sensor data and/or simulated sensor data may output perception data that is provided as input to the planning component 230. The planning component 230 may use the perception data to determine instructions for controlling motion of the vehicle 202, which may be used to control at least the simulated representation of the vehicle 202 in the simulation and, in some examples, may be additionally used to control real-world motion of the vehicle 202, such as in examples wherein the simulation component 236 executes on-vehicle during real-world operation.

In some examples, a performance component 234 may determine a performance metric 246 (e.g., score) associated with how the vehicle 202 performed in the simulation (and/or in real-world operation, if the planning component's instructions are being used to control the vehicle 202 in real-world operation). In some examples, the performance metric 246 may be based at least in part on a reinforcement learning reward. Such a reward may be based at least in part on how close the vehicle 202 is to violating an operating constraint and/or how close the vehicle 202 is to an operating target (e.g., maintaining a heading and/or velocity, distance from a target path or position). In some examples, the reward may be determined upon completion of at least a segment of the simulation, such as a time step (e.g., 10 milliseconds, 100 milliseconds, 500 milliseconds, 1 second, etc. of simulation or any other discretized portion of simulation, which may correspond go one or more computing cycles), or upon completion of the simulation (e.g., after the simulation completes up to a time horizon of simulation, such as two seconds in the future, five seconds in the future, or any other time; upon completion of a mission, such as by reaching a location, dropping off a passenger, or the like). In the latter example, the reward determined upon completion of the simulation may be a reward calculated for the entire simulation, which may include a sum total of rewards determined at time steps and/or an additional or alternate reward associated with the entire simulation. In some examples, the reward may be based at least in part on a long-term score associated with mission-related or other long-range time window (e.g., 1-second interval, 2-second interval, 5-second interval, one-minute interval, thirty-minute interval) and/or a short-term score associated with near-term time window (e.g., 10 milliseconds, 100 milliseconds, 500 milliseconds) or short-term goals, such as adherence to a trajectory. The long-term and/or short-term scores may be based at least in part on goals (e.g., mission-level goals for the long-term score or short-term goal, such as completing a trajectory, for the short-term score), trajectories (e.g., which may be a short-term goal), and/or operating constraints. In other words, mission completion, trajectories, and/or operating constraints may be used as the targets for reinforcement learning and determining the reward as part of a reinforcement learning.

The reward may be determined as part of reinforcement learning that is being used to train an ML component 248 of the vehicle 202. For example, the ML component 248 may be all or part of the localization component 226, perception component 228, and/or planning component 230. In at least one example, the ML component 248 may be all or part of the planning component 230—for example, the performance metric 246 and/or reward may be determined based on or per action output by the planning component 230. In other words, in at least one example, the performance component 234 may determine the performance metric 246 and/or reward for some or all of the one or more outputs of the planning component 230.

In some examples, the performance metric 246 may be used by a performance tracking component that may determine an aggregate performance of the vehicle (e.g., the component(s) of the vehicle that are being tested in the simulation) associated with a particular scenario. The performance tracking component 250 may determine a performance metric based at least in part on the reward and may store the performance metric in association with particular scenario data. The performance tracking component 250 may determine a performance metric for any scenario data that has been simulated. In some examples, the performance tracking component 250 may update the performance metric for every p number of iterations that a particular scenario is simulated or, in another example, the performance tracking component 250 may update the performance metric associated with a particular scenario any time that scenario is simulated by the simulation component 236. In some examples, the performance tracking component 250 may additionally or alternatively determine the probability associated with scenario data and/or adjust the probability associated with scenario data based at least in part on the performance metric associated therewith. For example, the scenario data determined (from among multiple scenario data associated with different scenarios) for simulation by the simulation component 236 may be determined based at least in part on a probability associated with the scenario data. In some examples, the performance metric and/or probability may be associated with scenario data in a tracking data structure.

The simulation component 236 may provide a safe and expeditious way of testing how the planning component 230 reacts to various scenarios that the vehicle 202 may or may not have encountered during operation, and determining whether or not the planning component 230 generates safe and/or efficacious control instructions to navigate the scenarios. Additionally or alternatively, the simulation component 236 may provide an additional or alternate manner of predicting object and/or environmental state(s), e.g., in addition to a nominal prediction component of the perception component 228.

In some examples, the simulation component 236 may additionally or alternatively store a ruleset and may determine whether the planning component 230 passed or failed a scenario based at least in part on the ruleset. The ruleset may be associated with and/or include operating constraint(s). In some examples, the simulation component 236 may record a version of the planning component 230 in association with a scenario identifier and/or an indication of whether the planning component 230 passed or failed. In an additional or alternate example, the simulation component 236 may determine a non-binary (e.g., continuous value) indication associated with performance of the planning component 230 (e.g., a score in addition to or instead of a pass/fail indication, such as the performance metric 246). The non-binary indication may be based at least in part on a set of weights associated with the ruleset. In some examples, the ruleset may be part of or replaced by an event detection system (U.S. patent application Ser. No. 16/682,971, filed Nov. 13, 2019, the entirety of which is incorporated herein by reference) and/or a collision monitoring system (U.S. patent application Ser. No. 16/703,625, filed Dec. 4, 2019, the entirety of which is incorporated herein by reference).

The memory 220 and/or 224 may additionally or alternatively store a mapping system, a planning system, a ride management system, etc. Although perception component 228, planning component 230, and/or performance component 234 are illustrated as being stored in memory 220 and/or 224, perception component 228, planning component 230, and/or performance component 234 may include processor-executable instructions, machine-learned model(s) (e.g., a neural network), and/or hardware.

As described herein, the localization component 226, the perception component 228, the planning component 230, performance component 234, the simulation component 236, and/or other components of the system 200 may comprise one or more ML models. For example, the localization component 226, the perception component 228, the planning component 230, performance component 234, and/or the simulation component 236 may each comprise different ML model pipelines. In some examples, an ML model may comprise a neural network. An exemplary neural network is a biologically inspired algorithm which passes input data through a series of connected layers to produce an output. Each layer in a neural network can also comprise another neural network, or can comprise any number of layers (whether convolutional or not). As can be understood in the context of this disclosure, a neural network can utilize machine-learning, which can refer to a broad class of such algorithms in which an output is generated based on learned parameters.

Although discussed in the context of neural networks, any type of machine-learning can be used consistent with this disclosure. For example, machine-learning algorithms can include, but are not limited to, regression algorithms (e.g., ordinary least squares regression (OLSR), linear regression, logistic regression, stepwise regression, multivariate adaptive regression splines (MARS), locally estimated scatterplot smoothing (LOESS)), instance-based algorithms (e.g., ridge regression, least absolute shrinkage and selection operator (LASSO), elastic net, least-angle regression (LARS)), decisions tree algorithms (e.g., classification and regression tree (CART), iterative dichotomiser 3 (ID3), Chi-squared automatic interaction detection (CHAID), decision stump, conditional decision trees), Bayesian algorithms (e.g., naïve Bayes, Gaussian naïve Bayes, multinomial naïve Bayes, average one-dependence estimators (AODE), Bayesian belief network (BNN), Bayesian networks), clustering algorithms (e.g., k-means, k-medians, expectation maximization (EM), hierarchical clustering), association rule learning algorithms (e.g., perceptron, back-propagation, Hopfield network, Radial Basis Function Network (RBFN)), deep learning algorithms (e.g., Deep Boltzmann Machine (DBM), Deep Belief Networks (DBN), Convolutional Neural Network (CNN), Stacked Auto-Encoders), Dimensionality Reduction Algorithms (e.g., Principal Component Analysis (PCA), Principal Component Regression (PCR), Partial Least Squares Regression (PLSR), Sammon Mapping, Multidimensional Scaling (MDS), Projection Pursuit, Linear Discriminant Analysis (LDA), Mixture Discriminant Analysis (MDA), Quadratic Discriminant Analysis (QDA), Flexible Discriminant Analysis (FDA)), Ensemble Algorithms (e.g., Boosting, Bootstrapped Aggregation (Bagging), AdaBoost, Stacked Generalization (blending), Gradient Boosting Machines (GBM), Gradient Boosted Regression Trees (GBRT), Random Forest), SVM (support vector machine), supervised learning, unsupervised learning, semi-supervised learning, etc. Additional examples of architectures include neural networks such as ResNet-50, ResNet-101, VGG, DenseNet, PointNet, and the like. In some examples, the ML model discussed herein may comprise PointPillars, SECOND, top-down feature layers (e.g., see U.S. patent application Ser. No. 15/963,833, which is incorporated by reference in its entirety herein), and/or VoxelNet. Architecture latency optimizations may include MobilenetV2, Shufflenet, Channelnet, Peleenet, and/or the like. The ML model may comprise a residual block such as Pixor, in some examples.

Memory 220 may additionally or alternatively store one or more system controller(s) (which may be a portion of the drive component(s)), which may be configured to control steering, propulsion, braking, safety, emitters, communication, and other systems of the vehicle 202. These system controller(s) may communicate with and/or control corresponding systems of the drive component(s) 212 and/or other components of the vehicle 202. For example, the planning component 230 may generate instructions based at least in part on perception data generated by the perception component 228 and/or simulated perception data and transmit the instructions to the system controller(s), which may control operation of the vehicle 202 based at least in part on the instructions.

It should be noted that while FIG. 2 is illustrated as a distributed system, in alternative examples, components of the vehicle 202 may be associated with the computing device(s) 214 and/or components of the computing device(s) 214 may be associated with the vehicle 202. That is, the vehicle 202 may perform one or more of the functions associated with the computing device(s) 214, and vice versa.

Example Scenario and Performance Tracking Data Structure

Figure 3:
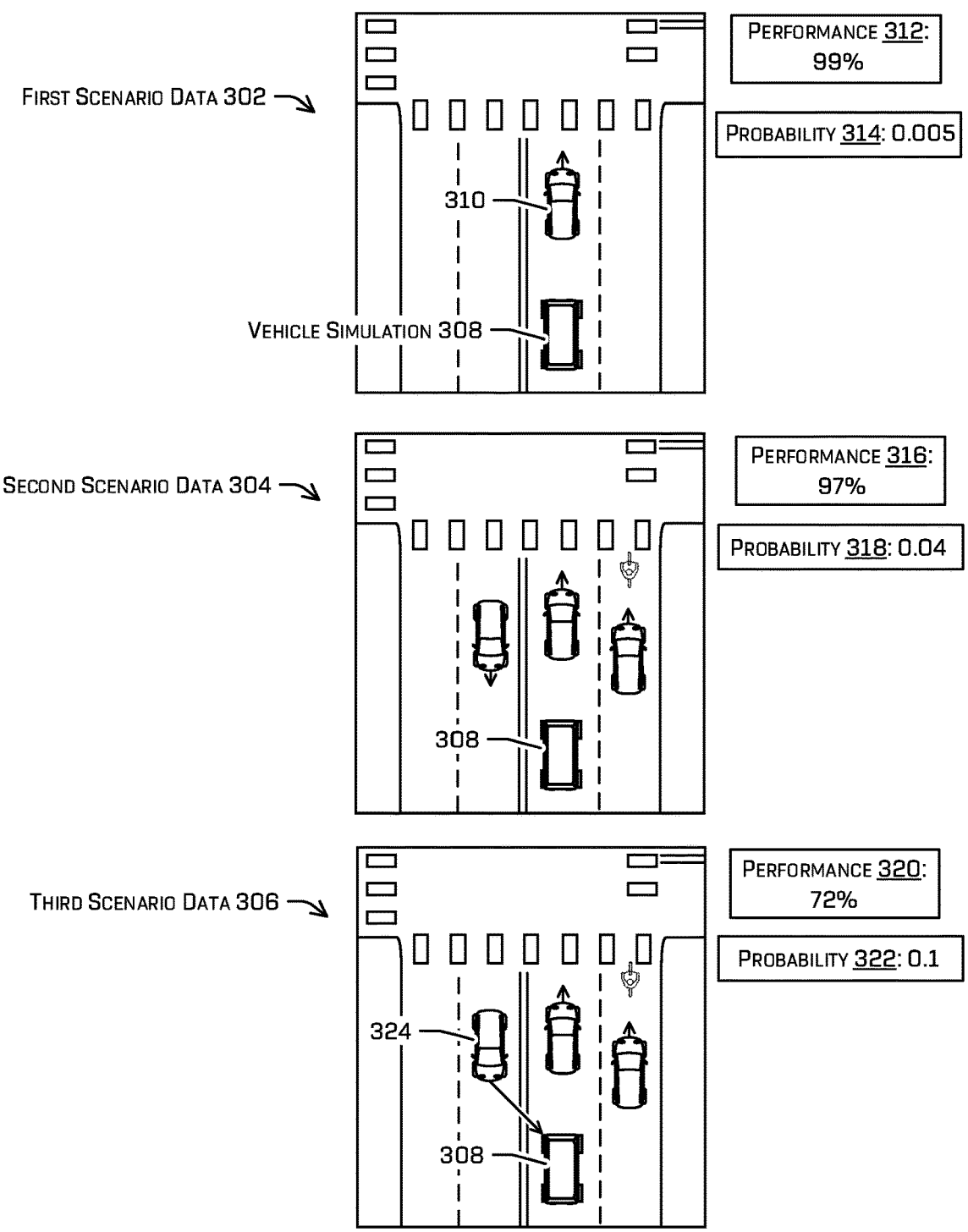
FIGS. 3 and 4 illustrate representations of tracking performance associated with various scenarios and the probabilities of simulation associated with the scenarios.
Figure 4:
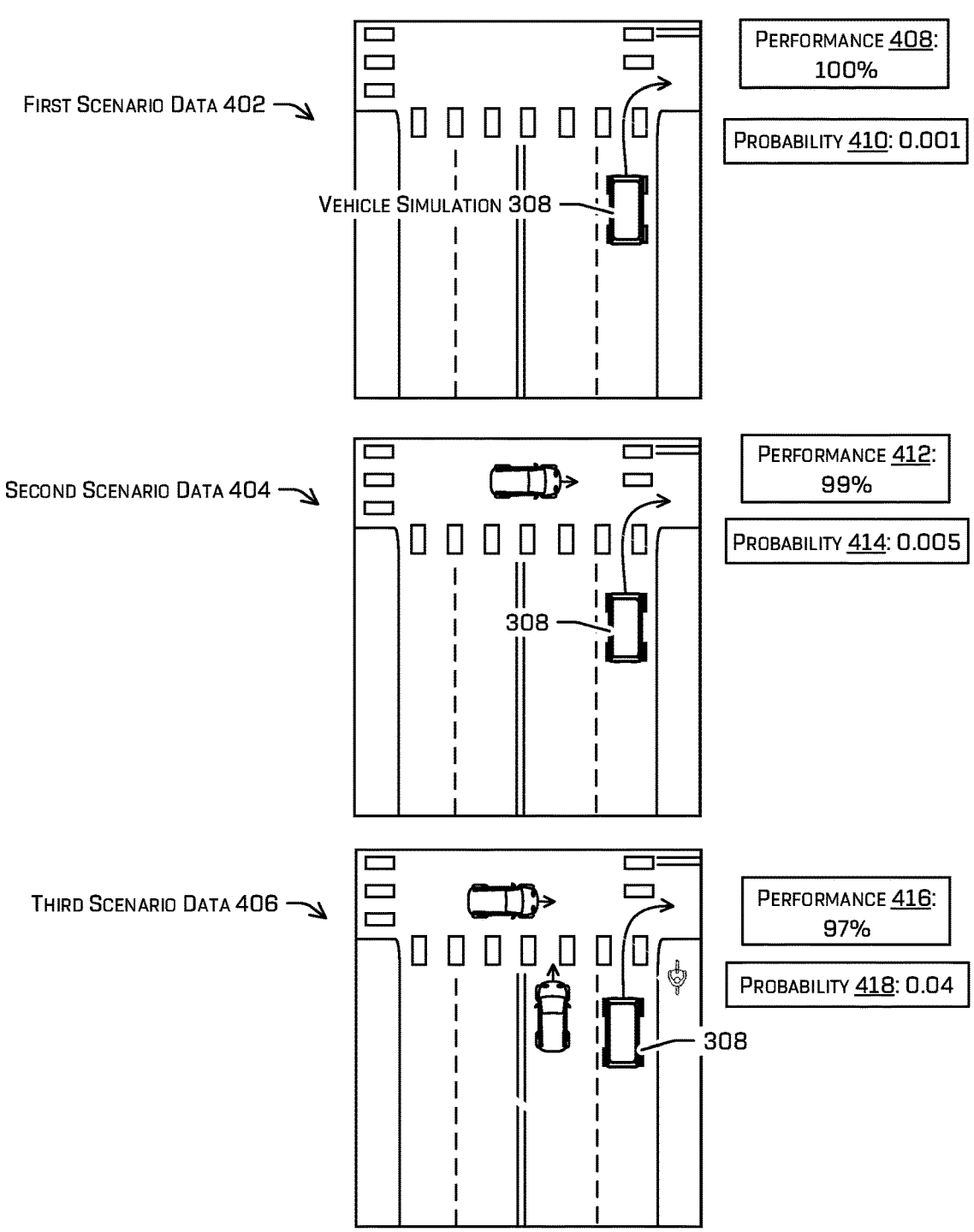

FIGS. 3 and 4 illustrate representations 300 and 400 of a scenario and performance tracking data structure associated with various scenarios and the probabilities of simulation associated with the scenarios. In some examples, a performance metric and probability may be associated with each set of scenario data. In some examples, the scenario and performance tracking data structure may comprise a first portion that may correspond with the scenario data and performance data illustrated in FIG. 3, 300; and the scenario and performance tracking data structure may comprise a second portion that may correspond with the scenario data and performance data illustrated in FIG. 4, 400. Although the representations 300 and 400 include representations of scenario data depicted as top-down illustrations of a particular point in time, the scenario data may additionally or alternatively include a data structure that specifies a position, velocity, acceleration, path, disposition (e.g., aggressive, conservative, inattentive, nominal), classification, and/or the like associated with an object; a mission and/or route associated with the autonomous vehicle; a state associated with the vehicle (e.g., whether all sensors, hardware, etc. are functional or not); an initial position, velocity, etc. of the simulated autonomous vehicle; a topology of the environment, weather conditions associated with the environment, a lighting state (e.g. sunny, cloudy, night), a location of light sources, and/or the like; a layout of the environment or a location of the environment within a global map; etc.

The representations 300 may comprise representations of first scenario data 302, second scenario data 304, and third scenario data 306 that may compose a portion of a scenario and performance tracking data structure. The first scenario data 302 may include data sufficient to instantiate and execute a simulation where a simulation 308 of the vehicle 202 is located behind a simulation of a vehicle 310 travelling in the same direction as the simulation 308. A performance metric 312 and probability 314 may be associated with the first scenario data 302. Similarly, a performance metric 316 and probability 318 may be associated with second scenario data 304, and performance metric 320 and probability 322 may be associated with third scenario data 306.

The performance metrics may indicate an aggregated performance of the vehicle 202 component's (s') control of the vehicle simulation 308 in simulations instantiated and executed according the particular scenario data, such as performance metric 312's association with first scenario data 302. In some examples, the performance metrics may be based at least in part on a reward determined as part of a training operation for improving the vehicle 202 component(s). In an additional or alternate example, the performance metric may be based at least in part on whether the vehicle component(s) successfully controlled the vehicle simulation 308 according to a binary indication. The binary indication may be generated based at least in part on determining whether a reward was determined (success) or a penalty was determined (failure), according to a rule set that determines a set of conditions that must be satisfied for a simulation to be considered a success (e.g., no impacts, no accelerations and/or jerks above a jerk threshold, no other objects within a threshold distance of the vehicle simulation 308 experience accelerations and/or jerks above a jerk threshold), and/or the reward was above a reward threshold (success) or below a threshold (failure). The performance metrics may be based on performance of the vehicle components during the simulation for all-time, a last batch of simulations, a last n number of simulations based on particular scenario data, and/or the like. The performance metrics 312, 316, and 320 indicate that the vehicle component(s) have performance best on the first scenario data 302 and worst on the third scenario data 306. This may be due to the third scenario data 306 being a more complex scenario including three simulated vehicles and a simulated cyclist, but may be mostly due to a simulated vehicle 324 that is controlled to cross a double-yellow line in front of the simulated vehicle 308. In some examples, a performance component may additionally or alternatively track a change in performance over one or more simulations. For example, the performance tracking component may determine a change in the performance metric/aggregated performance associated with the first scenario data 302 over the last r number of simulations, where r is a positive integer.

In some examples, the scenario data 302, 304, and 306 may be determined from based at least in part on log data, human input, procedurally, or a combination thereof. In some examples, if the performance metric for a scenario, such as second scenario data 304 meets or exceeds a threshold performance, the scenario data may be copied and modified to introduce a new scenario that has greater difficulty, which may result in the third scenario data 306. Similarly, second scenario data 304 may have been generated based at least in part on copying first scenario data 302 and modifying the scenario data to increase the difficulty associated therewith. In yet another example, any of the scenario data may have been generated separately, such as from log data, human modification of the log data, and/or human input alone.

In some examples, scenario data may be associated with a scenario type. For example, FIG. 3 and first scenario data 302, second scenario data 304, and third scenario data 306 may be associated with a first scenario type, vehicle following. In some examples, this type may be determined in association with the log data or may be determined in association with generation of the scenario data. For example, a machine-learned model may classify scenario data into a type.

The probabilities 314, 318, and 322 specify how likely each of the scenario data is to being selected/determined (e.g., used as a basis for use or alteration) for simulation. According to the techniques discussed herein, the probability 314 is lowest since the performance 312 is high or at least higher than the other probabilities. Note that the probabilities depicted in FIG. 3 may contemporaneously exist with the probabilities depicted in FIG. 4 and/or with other undepicted probabilities. Moreover, a probability, such as probability 322 or any of the other probabilities may be determined based at least in part on the performance metric associated with particular scenario data and/or upon the performance metric(s) associated with other scenario data. In some examples, the probability 322 or any of the other probabilities may be determined based at least in part on a change in a performance metric over r number of simulations. In other words, the probability 322 may be determined and/or altered based at least in part on a first-, second-, and/or third-order differential of the performance metric 320 over r simulations.

For example, FIG. 4 depicts representations of another portion of the scenario and performance tracking data structure 400. FIG. 4 depicts first scenario data 402, second scenario data 404, and third scenario data 406. The first scenario data 402 may be associated with a performance metric 408 indicating perfect performance and a probability 410 indicating a very low likelihood that the first scenario data 402 will be determined for simulation. In some examples, the first scenario data 402 may be determined based at least in part on log data from which second scenario data 404 was generated (e.g., by copying the second scenario data 404 after it was generated) and removing element(s) and/or simplifying element(s) (e.g., changing a time of day from night to day, changing weather from rainy to sunny) to provide a simple example to train the vehicle to execute a turn. The second scenario data 404 may be associated with a performance metric 412 and a probability 414; and the third scenario data 406 may be associated with a performance metric 416 and a probability 418. Each of scenarios 402-406 may be associated with a same vehicle path/mission of executing a right-hand turn, which may be used as the scenario type with which each of the scenario data 402-406 is associated (i.e., executing a turn in the depicted example).

Note that probability 410 may be based at least in part on probability(ies) 314, 318, 322, 412, 416, and/or other probability(ies) and/or may further be based at least in part on performance metric(s) associated with the respective scenario data associated therewith. This may be the reason that the probability 410 is the lowest among all the probabilities—the performance metric 408 is the highest (at least of the performance metrics depicted) and is already perfect, either of which may be a reason to reduce probability 410. Note that the techniques discussed herein may include increasing the probability as the performance metric associated with a scenario degrades.

Additionally, although the probabilities are depicted as being a number between 0 and 1, the probabilities may be represented in any other suitable form. Similarly, although the performance metric is indicated as being a percentage, the performance metric may be an average reward or any other suitable indication of performance by the vehicle.

Example Process(es)

Figure 5:
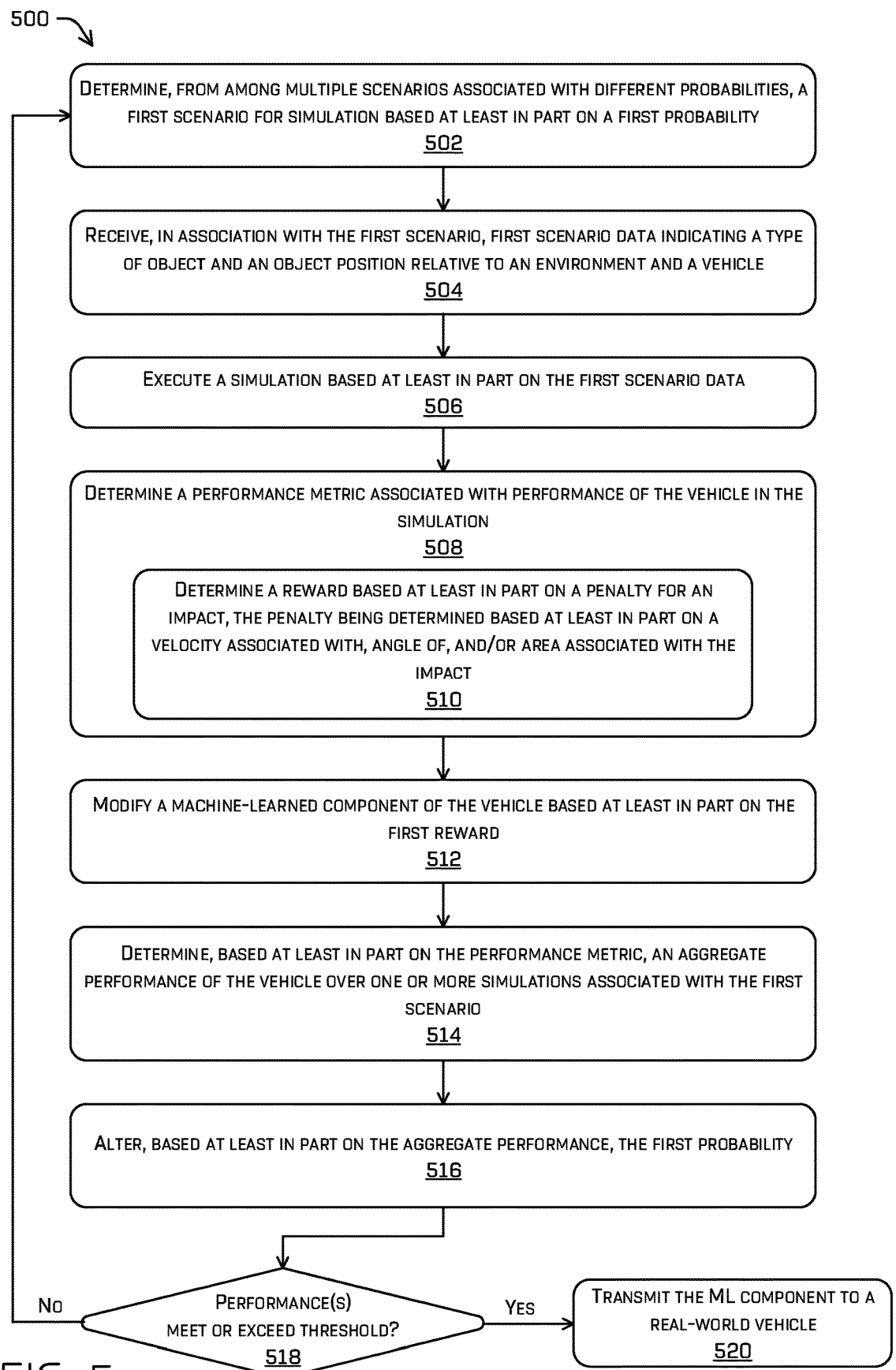
FIG. 5 illustrates a flow diagram of an example process for automatically controlling a reinforcement learning system for training a component of an autonomous vehicle.

FIG. 5 illustrates a flow diagram of an example process 500 for training a machine-learned component of a vehicle, such as vehicle 202, using a technique for automatically controlling a reinforcement learning system. In some examples, example process 500 may be accomplished by computing device(s) 214 and the resultant machine-learned component that is modified according to the techniques discussed herein may be transmitted to the vehicle 202. The resultant machine-learned component may be used in a pipeline of the vehicle 202 for receiving sensor data and controlling the vehicle 202, such as motion of the vehicle 202 via a drive system of the vehicle 202, or other systems of the vehicle (e.g., HVAC, doors, windows, interior and/or exterior emitters). Basically, any machine-learned component that is used to make determinations/decisions may be trained according to these techniques. To give an example, without limitation, the machine-learned component may include a localization component 226, perception component 228, planning component 230, and/or the performance component 234 itself.

Example process 500 may be accomplished by one or more components of a simulation component 236. The simulation component 236 may include hardware and/or software that are part of the autonomous vehicle or may be separate from the vehicle. Whether the simulation component 236 or a portion thereof is part of the autonomous vehicle and/or executes on the autonomous vehicle depends on whether example process 500 or at least a portion thereof is being executed on-vehicle, as opposed to offline or remote execution, such as for testing and developing the vehicle, as opposed to improving a planning component's operations live on-vehicle.

At operation 502, example process 500 may comprise determining, from among multiple scenarios associated with different probabilities, a first scenario for simulation based at least in part on a first probability associated with the first scenario, according to any of the techniques discussed herein. In some examples, each of the multiple scenarios may be initialized by being associated with a same probability. In an additional or alternate probability, probabilities from a previous batch of simulations may be used to initialize the probabilities. Determining the scenario may comprise sampling (e.g., randomly sampling) the multiple scenarios based at least in part on the probabilities associated therewith. The first scenario may be one of the multiple scenarios and the first probability may be one of the multiple probabilities. Sampling the probabilities may include retrieving the probabilities from a scenario data and performance tracking data structure stored in a memory.

At operation 504, example process 500 may comprise receiving scenario data associated with the first scenario, according to any of the techniques discussed herein. The scenario data may be retrieved from memory, the location of which may be identified by the scenario data and performance tracking data structure. The scenario data may comprise sensor data, scenario instructions, and/or a scenario data structure, according to any of the techniques discussed herein. In some examples, the scenario data structure may comprise a position, orientation, and/or characteristics of static object(s), dynamic object(s), and/or the simulated vehicle in the environment, which may correspond to real-time operation of an autonomous vehicle and/or may correspond to simulated operation of the autonomous vehicle. In some examples, a planning component of the autonomous vehicle may generate instructions for controlling the simulated vehicle in an agnostic manner to the simulation (e.g., the instructions generated by the planning component may be the same as those generated for a similar real-world situation). The operation of the planning component may be tested in this manner. In some examples, a component may translate instructions generated by the planning component to instructions for controlling the simulated vehicle in the simulated environment (e.g., updating a simulated state associated with the simulated vehicle, which may comprise a position, orientation, velocity, acceleration, heading, and/or the like associated with the simulated vehicle).

The scenario data may additionally or alternatively comprise an indication of an object type associated with one or more objects and/or characteristics associated with the one or more objects (e.g., a position, velocity, acceleration, heading, material type, kinematic coefficient). Any of the data discussed herein may be part of the scenario data structure associated with a portion of log data. The scenario data structure may comprise a two-dimensional image, a publish-subscribe message, and/or the like.

In some examples, the scenario data may indicate whether one or more objects in the simulation are controlled using randomized instructions and/or an extent to which an object is randomly controlled (i.e., the stochasticity of the control of the object(s)). The stochasticity may indicate an extent/bounds on randomization and/or a percentage of time or control that an object may be controlled according to randomization. For example, the stochasticity may specify that an object is only randomly controlled 20% of the time and is otherwise controlled using a path or according to some other indication in the scenario data. That 20% of the time, the stochasticity may additionally or alternatively specify bounds on the extent to which the path may be modified or random instructions may be generated (e.g., a maximum jerk, steering rate, or the like) and/or a number of variables of control that may be affected by the randomization, e.g., longitudinal acceleration, lateral acceleration, steering rate, emitter use (e.g., blinker activation, headlight activation, horn activation), or the like.

In some examples, the perception component may additionally or alternatively determine scenario data as the vehicle operates during real-world operation, such as to generate scenario data for later use or for determining prediction data in addition to or instead of predictions made by the nominal prediction component(s) of the planning component of the vehicle. For example, the perception component may generate a scenario data structure comprising at least part of the perception data. The data structure may indicate a layout of the environment and/or a number, type, or configuration of the objects in the environment, etc. The scenario data may then be used to instantiate the simulation (at the vehicle or off the vehicle, as discussed above). The perception data (which may comprise prediction data) and/or the scenario data structure may be associated with and/or added to the log data.

At operation 506, example process 500 may comprise executing a simulation based at least in part on the first scenario data, according to any of the techniques discussed herein. In some examples, operation 506 may comprise instantiating, based at least in part on the first scenario data, a simulated environment based at least in part on the scenario data, according to any of the techniques discussed herein. Operation 506 may comprise procedurally generating the simulated environment based at least in part on a set of template models associated with the object types identified in the scenario data. For example, the set of template models may comprise three different passenger vehicle models, four different pedestrian models, and/or the like. Any number of different models may exist. In some examples, a template model may comprise a three-dimensional model of a surface of an object without any texturing, although in additional or alternate examples, the model may comprise texture. Additionally or alternatively, operation 506 may comprise populating the simulated environment at least partially using perception data.

The template model may comprise a polygon mesh, a triangle mesh, and/or the like. In some examples, models associated with dynamic objects may have a higher polygon count than models associated with static objects. In some examples, the simulated environment may comprise surface models and lack lighting and/or textures. In additional or alternate examples, the simulated environment may comprise lighting and/or textures, but the techniques described herein work without lighting and/or textures. The simulated environment may comprise a model of the simulated vehicle. In some examples, instantiating the environment portion of the simulated environment may be based at least in part on log data, scenario data, and/or map data and objects in the environment may be based at least in part on instructions received as part of the scenario data (e.g., instructions generated based at least in part on user selection(s) and/or interaction with a user interface, procedurally-generated instructions).

Operation 506 may include providing data from the simulation component to the perception component 228 and/or the planning component 230. For example, the data may include a representation of the environment that simulated sensors may measure and/or simulated sensor data. Additionally or alternatively, operation 506 may comprise generating simulated sensor data. For example, the simulated sensor data may be generated based at least in part on a position, heading, etc. of the simulated vehicle in the simulation and a simulated location and orientation of simulated sensors associated with the simulated vehicle. In some examples, a simulated sensor may determine sensor data based at least in part on the simulation being executed. For example, U.S. patent application Ser. No. 16/581,632, filed Sep. 24, 2019 and incorporated herein, discusses this in more detail. In an additional or alternate example, the simulation executed by the simulation component may itself comprise simulated sensor data.

An output received from the planning component 230 may be used by the simulation component to control simulated actions of the simulated representation of the autonomous vehicle. This may comprise translating driving instructions for actuating a drive system of the vehicle to computer-executable instructions for updating a state of the simulation and/or modifying simulated sensor data based at least in part on the state of the simulation/the state of the simulated vehicle within the simulated environment. For example, the planning component 230 may determine a trajectory for controlling the vehicle based at least in part on perception data and/or controlling the vehicle using the trajectory, according to any of the techniques discussed herein. For example, the simulated sensor data (or real sensor data in some instances) may be provided to a perception component of the autonomous vehicle. The perception component may generate perception data used by the planning component to generate a trajectory, as discussed in more detail above. This trajectory may be translated by the simulation component to control motion of the simulated vehicle in the simulation. In instances where the simulation is running on-vehicle to improve the prediction and planning capabilities of the vehicle, the trajectory may be used to control motion of the vehicle in the real-world as well. In yet another example, the simulation may be associated with a future time, so the trajectory may not be implemented by the vehicle in the real-world at the same time that the trajectory is used to control the simulated vehicle. For example, hundreds, thousands, millions, or any other number of simulations may occur in the time between trajectory generation and implementation by the vehicle to improve the prediction data used to generate a trajectory for use by the vehicle.

At operation 508, example process 500 may comprise determining a performance metric associated with performance of the vehicle, according to any of the techniques discussed herein. Determining the performance metric may be based at least in part on simulated execution of a trajectory or another action determined by the planning component. In some examples, the performance metric may be determined based at least in part on a reward determined by a reinforcement learning algorithm. The reward may be positive or negative the reward may be a penalty. The reward may be determined as part of an action-reward feedback loop of a reinforcement learning algorithm and may be determined per vehicle action (e.g., per trajectory), per a predetermined number of actions (e.g., one reward calculated per n number of actions taken by the vehicle, where n is a positive integer), and/or upon completion of the simulation (e.g., by reaching a time horizon in the simulation, by completing a scenario, by reaching a resolution such as a violation of the operating constraints or completing a mission, by reaching a violation that meets or exceeds threshold(s) as discussed further herein). Determining the reward may be based at least in part on a set of rules, such as operating constraints, and may be accomplished by an ML model trained to score performance of the vehicle. For example, the ML model may comprise a reward function that determines a score based at least in part on the operating constraints discussed herein. This reward may be used to track performance of the vehicle over one or more iterations of the first scenario.

In some examples, the reward may be a weighted sum of sub-rewards. For example, the sub-rewards may be determined based at least in part on the operating constraint(s) (e.g., whether an operating constraint was violated, which may result in applying a penalty that overrides the weighted sum or a penalty that is part of the sum; whether the operating constraint(s) indicate that a near-miss occurred, as discussed in more detail in U.S. patent application Ser. No. 16/953,277, the entirety of which is incorporated herein by reference), generated by an ML model, and/or the like. In some examples, an ML model may be trained to receive a trajectory from a planning component of the vehicle and output a predicted likelihood that the trajectory will result in a near-miss or an impact, as discussed in more detail in Ser. No. 16/953,277. This likelihood may be used to determine a sub-reward. In one example, the ML model may output such a likelihood in association with a time in the future and may output multiple likelihoods, each associated with different future times. In such an instance, a reward determined based on one of these likelihoods may be associated with a weight—a set of weights associated with the sub-rewards generated from all the likelihoods may progressively downweight the likelihoods, the further the likelihoods are from a time associated with the trajectory (i.e., the further into the future the likelihoods are, as compared to a time associated with the trajectory's generation).

Determining the performance metric may additionally or alternatively be based at least in part on a number of object impacts; a severity of an impact, which may be based at least in part on a speed, angle, and/or area associated with the impact; conformity to a rule set; and/or the like. In some examples, the performance metric may itself by a differential of the performance metric over multiple simulations. The performance metric may additionally or alternatively be normalized according to one or more normalization factors, such as length of time of the simulation, distance and/or time the simulated vehicle successfully navigated the environment, and/or the like. In an additional or alternate example, the performance metric may be based at least in part on comparing performance of the simulated vehicle during the simulation to control of the simulated vehicle by a stock planning component that may have been trained according to other techniques or that may be controlled by a human.

The comparison may comprise determining whether control by the targeted ML model was better or worse than the stock planner, as measured by comparing the acceleration and/or jerk associated with the simulated vehicle or any other object(s) in the proximity of the simulated vehicle (to see whether the simulated vehicle had to hard stop, swerve, etc. or caused any other objects to do the same).

At operation 510, example process 500 may include determining a reward (i.e., a negative reward/a penalty) for an impact, the reward being determined based at least in part on a velocity, angle, and/or area associated with the impact. Operation 510 may be part of operation 508 when an impact occurs. In an instance where an impact occurred in the simulation, the penalty for an impact may override any of the other rewards and a negative reward (e.g., a penalty) may be applied to the vehicle's component that is being trained. In an additional or alternate example, a machine-learned model may receive simulation data (e.g., a record of the simulation, including the simulated impact) and may determine a severity of the impact, which may be used to determine a sub-reward. In some examples, this reward may be used in a weighted sum with other sub-rewards. For example, the impact may have been slight/de minimis (e.g., a bumper tap while parking, touching a curb)—such behavior should be penalized, but may not merit a penalty that overwhelms the other sub-rewards.

In some examples, the reward may be determined based at least in part on a velocity (e.g., a sum velocity of the objects involved, a velocity of the simulated autonomous vehicle, a vector sum of the velocities of the objects involved), angle of the impact, and/or area associated with the impact. The angle of the impact may be defined as an angle of the simulated autonomous vehicles trajectory relative to a center or center of gravity of the impacted object and/or a vector indicating a speed and direction of motion of the impacted object, whichever comes first. The area associated with the impact may include projecting (extrapolating) a position and space occupied by the simulated vehicle and a position and space occupied by the impacted object along the trajectory(ies) of the simulated vehicle and/or the impacted object at or near the time of impact. This extrapolation may be used to determine an area that indicates the maximum intersection area of the spaces occupied by the simulated vehicle and the object over the extrapolation. In some examples, the reward may be determined according to any of the following equations:

$$r = c + v^2 a \quad (1)$$

$$r = c + v^2 \quad (2)$$

$$r = c + va \quad (3)$$

$$r = c + v \quad (4)$$

where r is the reward, c is a constant term applied for any impact, v is a velocity of the impact, and a is the intersection area. The reward, as determined according to any of equations (1)-(4) may also be used to represent the severity of an impact. The angle may be used as an additional term in the equations above that may be normalized based on a maximum penalty value.

The severity of an impact may be used to determine when to end a simulation. Waiting until a high impact event occurs (i.e., an impact where the velocity and angle of the impact meet or exceed respective thresholds) may allow the training to occur more quickly since a larger penalty may be applied for high impact events as compared to impacts where the velocity and angle are less than the respective thresholds. In an additional or alternate example, if an impact occurs that does not have a severity (as determined according to one of the equations above or another equation) or velocity, angle, and/or area that meets or exceeds the respective thresholds and no high impact event occurs thereafter and the scenario ends, a penalty may be applied based on the earlier impact. If no high impact events have occurred in q number of scenarios, the rule may be removed and any impact may cause the scenario to end. Q may be a positive integer that may be pre-set.

At operation 512, example process 500 may comprise modifying an ML component of the vehicle based at least in part on the reward determined at operation 510. For example, operation 512 may be part of a reinforcement learning algorithm or may be used as part of another ML training technique. Regardless, the ML component may include, for example, the perception component, the planning component, the performance component, a portion of the simulation component, and/or the like. Operation 512 may include altering the ML component such that the reward would be increase and/or a penalty would be decreased. Note that using a penalty based at least in part on the velocity and/or angle of an impact may improve this operation by basically leading the vehicle away from decisions that would result in a greater impact until the simulated vehicle no longer impacts any other objects.

At operation 514, example process 500 may comprise determining, based at least in part on the performance metric, an aggregate performance of the vehicle over one or more simulations associated with the first scenario. In an example where the first scenario has previously been simulated, determining the aggregate performance may be based at least in part on a previous performance metric determined in association with the first scenario and/or a previous aggregate performance of the vehicle over multiple simulations associated with the first scenario. In some examples, determining the performance metric (i.e., the performance metric for a single simulation) and/or aggregate performance metric (i.e., the performance metric for multiple simulations) may include determining an average reward over multiple simulations of the first scenario, an average reward normalized to a percentage based at least in part on a maximum reward and/or a maximum penalty, an average reward normalized based at least in part on reward(s) associated with other scenarios, a success/failure percentage, and/or the like.

Success and/or failure may be defined by a set of rules and/or may be defined by a reward threshold. For example, the set of rules may specify that a scenario simulation was a success if the vehicle components control the simulated vehicle such that the vehicle doesn't impact any objects, doesn't generate a trajectory that includes an acceleration and/or jerk that meets or exceeds an acceleration threshold and/or jerk threshold, and/or cause another simulated object to experience an acceleration and/or jerk that meets or exceeds the same or a different acceleration threshold and/or jerk threshold. In an additional or alternate example, a success may be defined based at least in part on determining that the reward meets or exceeds a reward threshold. The rate of successes/failures may be tracked over multiple simulations of the first scenario. Note that this tracking may be done for any and/or all of the scenarios.

At operation 516, example process 500 may comprise altering, based at least in part on the first aggregate performance, the first probability associated with the first scenario. For example, as the performance metric increases or otherwise indicates improved performance, the probability may be reduced; whereas, as the performance metric decreases or otherwise indicates worsening performance, the probability may be increased. In other words, the first probability may be altered based at least in part on a change in the aggregate performance over multiple simulations (e.g., a differential of the performance metric and/or aggregated performance metric over multiple simulations). A positive differential may cause the probability to decrease whereas a negative differential may cause the probability to increase. In some examples, determining the extent of the alteration may be based at least in part on a probability associated with another scenario. For example, the sum of all the probabilities associated with the different scenarios may total 1. In such an example, an alteration to the first probability may include altering one or more probabilities associated with other scenario(s). In such an instance, the alteration to the first probability and to the one or more probabilities may be based on the aggregate performance metric(s) associated with the one or more scenarios (associated with the one or more probabilities) in addition to the first aggregate performance associated with the first scenario. In various examples, all of the probabilities associated with all the scenarios may be adjusted, all the probabilities except for a worst performing s scenarios may be modified, the best performing t scenarios may be modified, and/or the like, where s and t are positive integers that may or may not be the same. In some examples, altering the probability may additionally or alternatively include reducing the probability based at least in part on determining that the performance metric has not improved in u number of simulations, where u is a positive integer selected to prevent training from stagnating.

At operation 518, example process 500 may comprise determining whether a performance metric (e.g., an aggregate performance) associated with scenario(s) meets or exceeds a performance threshold. In some examples, operation 518 may comprise determining a percentage of the scenarios that are associated with an aggregate performance that meets or exceeds the performance threshold and determining whether the percentage meets or exceeds a threshold percentage. If the threshold is not met, example process 500 may determine a new scenario to simulate by returning to operation 502 where a new scenario may be determined for simulation based at least in part on randomly sampling the scenarios using the probabilities associated with the scenarios. If the performance metric associated with a scenario meets or exceeds a performance threshold, in some examples, the scenario data may be copied and a new scenario may be created from the copy. That copy may be modified to increase the difficulty thereof (e.g., by increasing the number and/or type of objects; changing object, weather, and/or environmental states; changing an object path to take the object closer to the simulated vehicle; increasing a stochasticity associated with control instructions for the object) and an initial probability may be assigned to the new scenario. In some examples, this copying step may not be implemented or only so many copies from a root scenario may be permitted.

Regardless, in some examples, if the percentage of scenarios that are associated with aggregate performances meets or exceeds a threshold percentage, example process 500 may transition to operation 520.

At operation 520, example process 500 may comprise transmitting the ML component to a real-world vehicle. The ML component may be added to a sensor data processing and/or planning pipeline or replace a component thereof as part of a software update operation. In an additional or alternate example where the ML component comprises at least a portion that is implemented in hardware, instructions may be transmitted to a machine for printing a circuit board, flashing an FPGA, or the like and/or instructions may be transmitted to a technician's computing device alerting the technician to replace a part or flash a memory of the real-world vehicle the next time the real-world vehicle is in for repairs or stops by a maintenance or charging station.

Example (Negative) Reward Determination

Figure 6A:
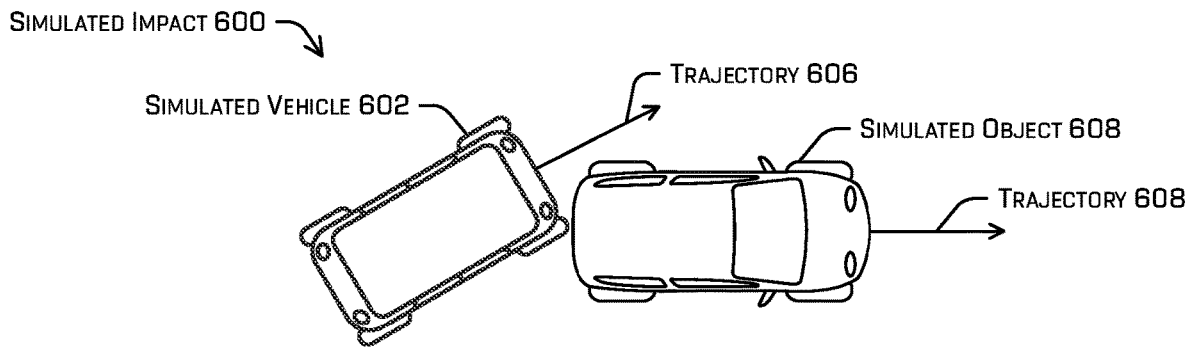
FIGS. 6A-6C depicts examples of determinations that may be made as part of determining a negative reward associated with a simulated impact with a simulated object.
Figure 6B:
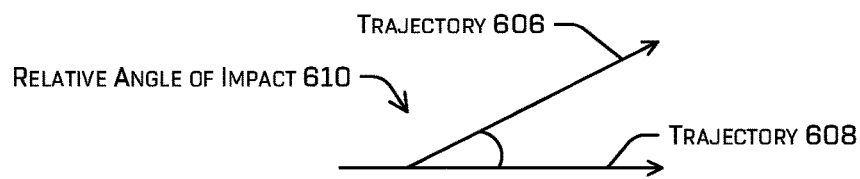
Figure 6C:
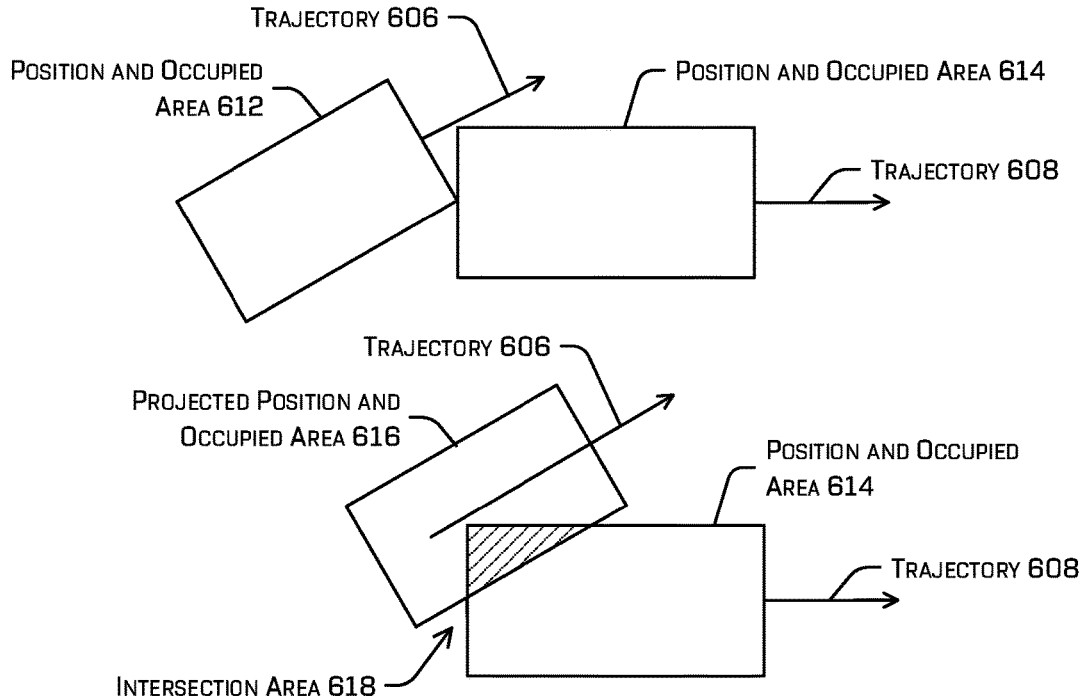

FIGS. 6A-6C depicts examples of determinations that may be made as part of determining a negative reward associated with a simulated impact with a simulated object. For example, the determinations may be part of operation 510 and/or 508 of example process 500. In some examples, such an operation may be triggered by the occurrence of an impact in a simulation.

FIG. 6A depicts such a simulated impact 600 where the simulated vehicle 602 has impacted a simulated object 604 in carrying out trajectory 606 while the simulated object 604 was executing trajectory 608. The simulated vehicle 602 may be a simulated representation of vehicle 202. In determining the extent of the penalty to apply to the machine-learned component, determining such a (negative) reward may include determining a velocity of the simulated vehicle 602 and/or the simulated object 608 at a time of impact or within a window of time before the impact. Such a window may be based on a velocity of the simulated vehicle 602 and/or the simulated object 608. In some examples, the velocity used for the reward determination may be just the velocity of the simulated vehicle 602 although in additional or alternate examples, the reward may be scaled based on a speed of the simulated object 608. For example, the scale may be greater if the simulated object 608 wasn't moving and may reduce as the simulated object 608's speed approaches a speed of the vehicle or a legal limit, above which the scale may severely drop off or may approach or equal 1.

FIG. 6B depicts an angle of impact that may be used as part of a reward determination in association with the impact. A relative angle of impact 610 between the trajectory 606 of the simulated vehicle 602 and the trajectory 608 of the impacted object, simulated object 608 in this case, may be used to determine the reward. In an additional or alternate example, the angle may be an angle of the trajectory 606 relative to a center or center of mass of the simulated object 608 that was impacted. There penalty applied may reach peaks at multiples of 90° (e.g., 0°, 90°, 180°) and may be at minimums at multiples of 45°. This may be the case to more heavily penalize head-on, T-bone, and rear-ending impacts as opposed to glancing impacts.

FIG. 6C depicts an example of how an intersection area may be determined for use in a reward determination. Determining the intersection area may include determining a position and/or occupied area 612 of the simulated vehicle 602 at or near the (simulation) time of impact and a position and/or occupied area 614 of the impacted object. Together, the position and occupied area indication may indicate a position and/or orientation of the area occupied by the respective object. In some examples, the position and occupied area 612 associated with the simulated vehicle may be extrapolated based at least in part on the trajectory 606 that the vehicle was executing without regard for the simulated object 608. In other words, static kinematics due to tire interactions with the ground, air resistance, etc. may be preserved but the simulated object 608 may be treated as not existing.

FIG. 6C depicts such a projected position and occupied area 616 that may be the result of extrapolating the position and occupied area 612 along trajectory 606. This projection may be used to determine a maximum overlap of the projected occupied area 616 over the position and occupied area 614 of the impacted object. This maximum overlap may be indicated as an intersection area 618. maximal intersection area between the occupied area 612 and position and occupied area 614. Note that, although only the position and occupied area 612 is projected in FIG. 6C, the position and occupied area 614 of the impacted object may also be projected. In the depicted instance, extrapolating the position and occupied area 614 along trajectory 608 does not result in a maximum intersection. So, for the sake of clarity, the extrapolation is not depicted. This intersection area 618 may be used as part of the reward determination—the greater the area, the greater the penalty (the greater the negative magnitude of the reward).

Example Clauses

A: A method comprising: determining a scenario from a plurality of scenarios based at least in part on a probability associated with the scenario, the scenario to be used for simulation and training a machine-learned (ML) component associated with a vehicle; receiving, in association with the scenario, first scenario data indicating a type of object and an object position relative to an environment and a simulated vehicle; generating a simulation based at least in part on the first scenario data; determining a severity of an impact with another object during the simulation; determining a performance metric associated with performance of the simulated vehicle in the simulation; modifying the ML component based at least in part on the severity; determining, based at least in part on the performance metric and at least one previous performance metric determined in association with the first scenario, an aggregate performance of the vehicle over multiple simulations associated with the first scenario; altering, based at least in part on the aggregate performance, the probability; and transmitting the ML component to a real-world vehicle, wherein operation of the real-world vehicle is based at least in part on executing the ML component.

B: The method of paragraph A, wherein the aggregate performance is a first aggregate performance and wherein the altering comprises: increasing the probability based at least in part on determining that the first aggregate performance associated with the first scenario has decreased, or decreasing the probability based at least in part on determining that a second aggregate performance associated with a second scenario has decreased and the first aggregate performance is the same or has increased.

C: The method of either paragraph A or B, wherein the altering further comprises altering an additional probability associated with an additional scenario of the plurality of scenarios based at least in part on the altering the probability, and wherein the additional probability indicates another probability that the second scenario is to be used for simulation and training the ML component.

D: The method of any one of paragraphs A-C, further comprising: controlling a simulated object in the simulation based at least in part on randomizing instructions that control movement of the simulated object in the simulation, wherein the randomization is bounded by a maximum jerk, maximum acceleration, or maximum steering rate.

E: The method of any one of paragraphs A-D, wherein determining the severity is based at least in part on at least one of: determining a velocity and angle at which an impact with another object occurred during the simulation; or determining an intersection of a first area and a second area, wherein: the first area is determined by projecting a first occupied area associated with the simulated vehicle along a first trajectory associated with the simulated vehicle; and the second area is determined by projecting a second occupied area associated with the other object along a second trajectory associated with the other object.

F: The method of any one of paragraphs A-E, wherein the impact is a first impact, the severity is a first severity, and the method further comprises: continuing to execute the simulation when the first impact occurs based at least in part on determining that at least one of a first velocity associated with the impact is less than a threshold velocity, a first angle associated with the impact is outside a range of angles, or the first severity is less than a severity threshold; and stopping the simulation when a second impact occurs between the vehicle and a second simulated object based at least in part on determining that at least one of a second velocity associated with the second impact meets or exceeds the threshold velocity, a second angle associated with the second impact is within the range of angles, or a second severity determined in association with the second impact meets or exceeds the severity threshold.

G: A system comprising: one or more processors; and a memory storing processor-executable instructions that, when executed by the one or more processors, cause the system to perform operations comprising: determining a scenario from a plurality of scenarios based at least in part on a probability associated with the scenario, the scenario to be used for simulation and training a machine-learned (ML) component associated with a vehicle; receiving, in association with the scenario, first scenario data; generating a simulation based at least in part on the first scenario data; determining a severity of an impact with another object during the simulation; modifying the ML component based at least in part on the severity; and transmitting the ML component to a real-world vehicle, wherein operation of the real-world vehicle is based at least in part on executing the ML component.

H: The system of paragraph G, wherein the operations further comprise: determining a performance metric associated with performance of the simulated vehicle in the simulation; determining, based at least in part on the performance metric and at least one previous performance metric determined in association with the first scenario, an aggregate performance of the vehicle over multiple simulations associated with the first scenario; and altering, based at least in part on the aggregate performance, the probability.

I: The system of paragraph H, the aggregate performance is a first aggregate performance and wherein the altering comprises: increasing the probability based at least in part on determining that the first aggregate performance associated with the first scenario has decreased, or decreasing the probability based at least in part on determining that a second aggregate performance associated with a second scenario has decreased and the first aggregate performance is the same or has increased.

J: The system of either paragraph H or I, wherein the altering further comprises altering an additional probability associated with an additional scenario of the plurality of scenarios based at least in part on the altering the probability, and wherein the additional probability indicates another probability that the second scenario is to be used for simulation and training the ML component.

K: The system of any one of paragraphs H-J, wherein the operations further comprise: determining that the aggregate performance of the vehicle over multiple simulations associated with the first scenario meets or exceeds a threshold score; copying the first scenario data and adding at least one of an additional object, junction complexity, road complexity, or environmental condition to the first scenario data, as second scenario data; generating a second simulation based at least in part on the second scenario data; determining a second reward associated with performance of the vehicle in the second simulation; and modifying the ML component based at least in part on the second reward.

L: The system of any one of paragraphs G-K, wherein the operations further comprise controlling a simulated object in the simulation based at least in part on randomizing instructions that control movement of the simulated object in the simulation, wherein the randomization is bounded by a maximum jerk, maximum acceleration, or maximum steering rate.

M: The system of any one of paragraphs G-L, wherein determining the severity is based at least in part on at least one of: determining a velocity and angle at which an impact with another object occurred during the simulation; or determining an intersection of a first area and a second area, wherein: the first area is determined by projecting a first occupied area associated with the simulated vehicle along a first trajectory associated with the simulated vehicle; and the second area is determined by projecting a second occupied area associated with the other object along a second trajectory associated with the other object.

N: The system of any one of paragraphs G-M, wherein the impact is a first impact, the severity is a first severity, and the operations further comprise: continuing to execute the simulation when the first impact occurs based at least in part on determining that at least one of a first velocity associated with the impact is less than a threshold velocity, a first angle associated with the impact is outside a range of angles, or the first severity is less than a severity threshold; and stopping the simulation when a second impact occurs between the vehicle and a second simulated object based at least in part on determining that at least one of a second velocity associated with the second impact meets or exceeds the threshold velocity, a second angle associated with the second impact is within the range of angles, or a second severity determined in association with the second impact meets or exceeds the severity threshold.

O: One or more non-transitory computer-readable media storing processor-executable instructions that, when executed by one or more processors, cause the one or more processors to perform operations comprising: determining a scenario from a plurality of scenarios based at least in part on a probability associated with the scenario, the scenario to be used for simulation and training a machine-learned (ML) component associated with a vehicle; receiving, in association with the scenario, first scenario data; generating a simulation based at least in part on the first scenario data; determining a severity of an impact with another object during the simulation; modifying the ML component based at least in part on the severity; and transmitting the ML component to a real-world vehicle, wherein operation of the real-world vehicle is based at least in part on executing the ML component.

P: The one or more non-transitory computer-readable media of paragraph O, wherein the operations further comprise: determining a performance metric associated with performance of the simulated vehicle in the simulation; determining, based at least in part on the performance metric and at least one previous performance metric determined in association with the first scenario, an aggregate performance of the vehicle over multiple simulations associated with the first scenario; and altering, based at least in part on the aggregate performance, the probability.

Q: The one or more non-transitory computer-readable media of paragraph P, wherein the operations further comprise: determining that the aggregate performance of the vehicle over multiple simulations associated with the first scenario meets or exceeds a threshold score; copying the first scenario data and adding at least one of an additional object, junction complexity, road complexity, or environmental condition to the first scenario data, as second scenario data; generating a second simulation based at least in part on the second scenario data; determining a second reward associated with performance of the vehicle in the second simulation; and modifying the ML component based at least in part on the second reward.

R: The one or more non-transitory computer-readable media of any one of paragraphs O-Q, wherein the operations further comprise controlling a simulated object in the simulation based at least in part on randomizing instructions that control movement of the simulated object in the simulation, wherein the randomization is bounded by a maximum jerk, maximum acceleration, or maximum steering rate.

S: The one or more non-transitory computer-readable media of any one of paragraphs O-R, wherein determining the severity is based at least in part on at least one of: determining a velocity and angle at which an impact with another object occurred during the simulation; or determining an intersection of a first area and a second area, wherein: the first area is determined by projecting a first occupied area associated with the simulated vehicle along a first trajectory associated with the simulated vehicle; and the second area is determined by projecting a second occupied area associated with the other object along a second trajectory associated with the other object.

T: The one or more non-transitory computer-readable media of any one of paragraphs O-S, wherein the impact is a first impact, the severity is a first severity, and the operations further comprise: continuing to execute the simulation when the first impact occurs based at least in part on determining that at least one of a first velocity associated with the impact is less than a threshold velocity, a first angle associated with the impact is outside a range of angles, or the first severity is less than a severity threshold; and stopping the simulation when a second impact occurs between the vehicle and a second simulated object based at least in part on determining that at least one of a second velocity associated with the second impact meets or exceeds the threshold velocity, a second angle associated with the second impact is within the range of angles, or a second severity determined in association with the second impact meets or exceeds the severity threshold.

While the example clauses described above are described with respect to one particular implementation, it should be understood that, in the context of this document, the content of the example clauses can also be implemented via a method, device, system, computer-readable medium, and/or another implementation. Additionally, any of examples A-T may be implemented alone or in combination with any other one or more of the examples A-T.

CONCLUSION

Although the subject matter has been described in language specific to structural features and/or methodological acts, it is to be understood that the subject matter defined in the appended claims is not necessarily limited to the specific features or acts described. Rather, the specific features and acts are disclosed as example forms of implementing the claims.

The components described herein represent instructions that may be stored in any type of computer-readable medium and may be implemented in software and/or hardware. All of the methods and processes described above may be embodied in, and fully automated via, software code components and/or computer-executable instructions executed by one or more computers or processors, hardware, or some combination thereof. Some or all of the methods may alternatively be embodied in specialized computer hardware.

At least some of the processes discussed herein are illustrated as logical flow graphs, each operation of which represents a sequence of operations that can be implemented in hardware, software, or a combination thereof. In the context of software, the operations represent computer-executable instructions stored on one or more non-transitory computer-readable storage media that, when executed by one or more processors, cause a computer or autonomous vehicle to perform the recited operations. Generally, computer-executable instructions include routines, programs, objects, components, data structures, and the like that perform particular functions or implement particular abstract data types. The order in which the operations are described is not intended to be construed as a limitation, and any number of the described operations can be combined in any order and/or in parallel to implement the processes.

Conditional language such as, among others, "may," "could," "may" or "might," unless specifically stated otherwise, are understood within the context to present that certain examples include, while other examples do not include, certain features, elements and/or steps. Thus, such conditional language is not generally intended to imply that certain features, elements and/or steps are in any way required for one or more examples or that one or more examples necessarily include logic for deciding, with or without user input or prompting, whether certain features, elements and/or steps are included or are to be performed in any particular example.

Conjunctive language such as the phrase "at least one of X, Y or Z," unless specifically stated otherwise, is to be understood to present that an item, term, etc. may be either X, Y, or Z, or any combination thereof, including multiples of each element. Unless explicitly described as singular, "a" means singular and plural.

Any routine descriptions, elements or blocks in the flow diagrams described herein and/or depicted in the attached figures should be understood as potentially representing modules, segments, or portions of code that include one or more computer-executable instructions for implementing specific logical functions or elements in the routine. Alternate implementations are included within the scope of the examples described herein in which elements or functions may be deleted, or executed out of order from that shown or discussed, including substantially synchronously, in reverse order, with additional operations, or omitting operations, depending on the functionality involved as would be understood by those skilled in the art. Note that the term substantially may indicate a range. For example, substantially simultaneously may indicate that two activities occur within a time range of each other, substantially a same dimension may indicate that two elements have dimensions within a range of each other, and/or the like.

Many variations and modifications may be made to the above-described examples, the elements of which are to be understood as being among other acceptable examples. All such modifications and variations are intended to be included herein within the scope of this disclosure and protected by the following claims.

What is claimed is:

1. A method comprising:
   determining a scenario from a plurality of scenarios based at least in part on a probability associated with the scenario, the scenario to be used for simulation and training a machine-learned (ML) component associated with a vehicle,
   wherein the probability indicates a likelihood of the scenario being selected from among the plurality of scenarios for simulation and training;
   receiving, in association with the scenario, first scenario data indicating a type of object and an object position relative to an environment and a simulated vehicle;
   generating a simulation based at least in part on the first scenario data;
   determining a severity of an impact with another object during the simulation;
   determining a performance metric associated with performance of the simulated vehicle in the simulation;
   modifying the ML component based at least in part on the severity;
   determining, based at least in part on the performance metric and at least one previous performance metric determined in association with the first scenario, an aggregate performance of the vehicle over multiple simulations associated with the first scenario;
   altering, based at least in part on the aggregate performance, the probability; and
   transmitting the ML component to a real-world vehicle, wherein operation of the real-world vehicle is based at least in part on executing the ML component.

2. The method of claim 1, wherein the aggregate performance is a first aggregate performance and wherein the altering comprises:
   increasing the probability based at least in part on determining that the first aggregate performance associated with the first scenario has decreased, or
   decreasing the probability based at least in part on determining that a second aggregate performance associated with a second scenario has decreased and the first aggregate performance is the same or has increased.

3. The method of claim 2, wherein the altering further comprises altering an additional probability associated with an additional scenario of the plurality of scenarios based at least in part on the altering the probability, and wherein the additional probability indicates another probability that the second scenario is to be used for simulation and training the ML component.

4. The method of claim 1, further comprising: controlling a simulated object in the simulation based at least in part on randomizing instructions that control movement of the simulated object in the simulation, wherein the randomization is bounded by a maximum jerk, maximum acceleration, or maximum steering rate.

5. The method of claim 1, wherein determining the severity is based at least in part on at least one of:
   determining a velocity and angle at which an impact with another object occurred during the simulation; or
   determining an intersection of a first area and a second area, wherein:
      the first area is determined by projecting a first occupied area associated with the simulated vehicle along a first trajectory associated with the simulated vehicle; and the second area is determined by projecting a second occupied area associated with the other object along a second trajectory associated with the other object.

6. The method of claim 1, wherein the impact is a first impact, the severity is a first severity, and the method further comprises:
continuing to execute the simulation when the first impact occurs based at least in part on determining that at least one of a first velocity associated with the impact is less than a threshold velocity, a first angle associated with the impact is outside a range of angles, or the first severity is less than a severity threshold; and
stopping the simulation when a second impact occurs between the vehicle and a second simulated object based at least in part on determining that at least one of a second velocity associated with the second impact meets or exceeds the threshold velocity, a second angle associated with the second impact is within the range of angles, or a second severity determined in association with the second impact meets or exceeds the severity threshold.

7. A system comprising:
one or more processors; and
a memory storing processor-executable instructions that, when executed by the one or more processors, cause the system to perform operations comprising:
determining a scenario from a plurality of scenarios based at least in part on a probability associated with the scenario, the scenario to be used for simulation and training a machine-learned (ML) component associated with a vehicle;
wherein the probability indicates a likelihood of the scenario to be selected for simulation and training;
receiving, in association with the scenario, first scenario data;
generating a simulation based at least in part on the first scenario data;
determining a severity of an impact with another object during the simulation;
modifying the ML component based at least in part on the severity; and
transmitting the ML component to a real-world vehicle, wherein operation of the real-world vehicle is based at least in part on executing the ML component.

8. The system of claim 7, wherein the operations further comprise:
determining a performance metric associated with performance of a simulated vehicle in the simulation;
determining, based at least in part on the performance metric and at least one previous performance metric determined in association with the first scenario, an aggregate performance of the vehicle over multiple simulations associated with the first scenario; and
altering, based at least in part on the aggregate performance, the probability.

9. The system of claim 8, the aggregate performance is a first aggregate performance and wherein the altering comprises:
increasing the probability based at least in part on determining that the first aggregate performance associated with the first scenario has decreased, or
decreasing the probability based at least in part on determining that a second aggregate performance associated with a second scenario has decreased and the first aggregate performance is the same or has increased.

10. The system of claim 1, wherein the altering further comprises altering an additional probability associated with an additional scenario of the plurality of scenarios based at least in part on the altering the probability, and wherein the additional probability indicates another probability that the second scenario is to be used for simulation and training the ML component.

11. The system of claim 8, wherein the operations further comprise:
determining that the aggregate performance of the vehicle over multiple simulations associated with the first scenario meets or exceeds a threshold score;
copying the first scenario data and adding at least one of an additional object, junction complexity, road complexity, or environmental condition to the first scenario data, as second scenario data;
generating a second simulation based at least in part on the second scenario data;
determining a second reward associated with performance of the vehicle in the second simulation; and
modifying the ML component based at least in part on the second reward.

12. The system of claim 7, wherein the operations further comprise controlling a simulated object in the simulation based at least in part on randomizing instructions that control movement of the simulated object in the simulation, wherein the randomization is bounded by a maximum jerk, maximum acceleration, or maximum steering rate.

13. The system of claim 7, wherein determining the severity is based at least in part on at least one of:
determining a velocity and angle at which an impact with another object occurred during the simulation; or
determining an intersection of a first area and a second area, wherein:
the first area is determined by projecting a first occupied area associated with the simulated vehicle along a first trajectory associated with the simulated vehicle; and
the second area is determined by projecting a second occupied area associated with the other object along a second trajectory associated with the other object.

14. The system of claim 7, wherein the impact is a first impact, the severity is a first severity, and the operations further comprise:
continuing to execute the simulation when the first impact occurs based at least in part on determining that at least one of a first velocity associated with the impact is less than a threshold velocity, a first angle associated with the impact is outside a range of angles, or the first severity is less than a severity threshold; and
stopping the simulation when a second impact occurs between the vehicle and a second simulated object based at least in part on determining that at least one of a second velocity associated with the second impact meets or exceeds the threshold velocity, a second angle associated with the second impact is within the range of angles, or a second severity determined in association with the second impact meets or exceeds the severity threshold.

15. One or more non-transitory computer-readable media storing processor-executable instructions that, when executed by one or more processors, cause the one or more processors to perform operations comprising:
determining a scenario from a plurality of scenarios based at least in part on a probability associated with the scenario, the scenario to be used for simulation and training a machine-learned (ML) component associated with a vehicle;

wherein the probability indicates a likelihood of the scenario to be selected for simulation and training;

receiving, in association with the scenario, first scenario data;

generating a simulation based at least in part on the first scenario data;

determining a severity of an impact with another object during the simulation;

modifying the ML component based at least in part on the severity; and transmitting the ML component to a real-world vehicle, wherein operation of the real-world vehicle is based at least in part on executing the ML component.

16. The one or more non-transitory computer-readable media of claim 15, wherein the operations further comprise: determining a performance metric associated with performance of a simulated vehicle in the simulation; determining, based at least in part on the performance metric and at least one previous performance metric determined in association with the first scenario, an aggregate performance of the vehicle over multiple simulations associated with the first scenario; and altering, based at least in part on the aggregate performance, the probability.

17. The one or more non-transitory computer-readable media of claim 16, wherein the operations further comprise:
determining that the aggregate performance of the vehicle over multiple simulations associated with the first scenario meets or exceeds a threshold score;
copying the first scenario data and adding at least one of an additional object, junction complexity, road complexity, or environmental condition to the first scenario data, as second scenario data;
generating a second simulation based at least in part on the second scenario data;
determining a second reward associated with performance of the vehicle in the second simulation; and
modifying the ML component based at least in part on the second reward.

18. The one or more non-transitory computer-readable media of claim 15, wherein the operations further comprise controlling a simulated object in the simulation based at least in part on randomizing instructions that control movement of the simulated object in the simulation, wherein the randomization is bounded by a maximum jerk, maximum acceleration, or maximum steering rate.

19. The one or more non-transitory computer-readable media of claim 15, wherein determining the severity is based at least in part on at least one of:
determining a velocity and angle at which an impact with another object occurred during the simulation; or
determining an intersection of a first area and a second area, wherein:
the first area is determined by projecting a first occupied area associated with the simulated vehicle along a first trajectory associated with the simulated vehicle; and
the second area is determined by projecting a second occupied area associated with the other object along a second trajectory associated with the other object.

20. The one or more non-transitory computer-readable media of claim 15, wherein the impact is a first impact, the severity is a first severity, and the operations further comprise:
continuing to execute the simulation when the first impact occurs based at least in part on determining that at least one of a first velocity associated with the impact is less than a threshold velocity, a first angle associated with the impact is outside a range of angles, or the first severity is less than a severity threshold; and
stopping the simulation when a second impact occurs between the vehicle and a second simulated object based at least in part on determining that at least one of a second velocity associated with the second impact meets or exceeds the threshold velocity, a second angle associated with the second impact is within the range of angles, or a second severity determined in association with the second impact meets or exceeds the severity threshold.

* * * * *